United States Patent
Pang et al.

(10) Patent No.: US 9,165,659 B1
(45) Date of Patent: Oct. 20, 2015

(54) EFFICIENT REPROGRAMMING METHOD FOR TIGHTENING A THRESHOLD VOLTAGE DISTRIBUTION IN A MEMORY DEVICE

(71) Applicant: SanDisk Technologies Inc., Plano, TX (US)

(72) Inventors: Liang Pang, Fremont, CA (US); Hong-Yan Chen, Sunnyvale, CA (US); Yingda Dong, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 10 days.

(21) Appl. No.: 14/272,758

(22) Filed: May 8, 2014

(51) Int. Cl.
*G11C 11/34* (2006.01)
*G11C 16/10* (2006.01)
*G11C 16/34* (2006.01)
*G11C 16/04* (2006.01)

(52) U.S. Cl.
CPC ............ *G11C 16/10* (2013.01); *G11C 16/0466* (2013.01); *G11C 16/3459* (2013.01)

(58) Field of Classification Search
CPC ... G11C 16/10; G11C 16/3459; G11C 16/046
USPC ............ 365/185.22, 185.17, 185.18, 185.25, 365/185.26
See application file for complete search history.

(56) References Cited

U.S. PATENT DOCUMENTS

| | | | |
|---|---|---|---|
| 7,385,851 B1 | 6/2008 | Park et al. | |
| 7,447,081 B2 | 11/2008 | Chan | |
| 7,474,566 B2 | 1/2009 | Jung et al. | |
| 7,616,496 B2 | 11/2009 | Choi et al. | |
| 7,692,970 B2 | 4/2010 | Park et al. | |
| 8,000,150 B2 | 8/2011 | Seol et al. | |
| 8,116,140 B2* | 2/2012 | Dong et al. | 365/185.19 |
| 8,472,257 B2 | 6/2013 | Dong et al. | |
| 8,477,534 B2 | 7/2013 | Iwai et al. | |

(Continued)

FOREIGN PATENT DOCUMENTS

WO    WO2007/079062 A1    7/2007

OTHER PUBLICATIONS

Jo, Sung-Min, et al., "A Study of Cells Having Largely Generated Random Telegraph Noise in Floating Gate NAND Flash Memory," School of Electrical Engineering and Computer Science, Kyungpook National University, Korea, Feb. 2009, 2 pages.

(Continued)

*Primary Examiner* — Richard Elms
*Assistant Examiner* — Mohammed A Bashar
(74) *Attorney, Agent, or Firm* — Vierra Magen Marcus LLP

(57) ABSTRACT

Techniques are provided for programming memory cells while reducing the effects of detrapping which cause a downshift in the threshold voltage distribution. Detrapping is particularly problematic for charge-trapping memory cells such as in a 3D stacked non-volatile memory device. During programming, a temporary lockout mode is provided for memory cells which pass a verify test. During a checkpoint program-verify iteration, all memory cells of a target data state are subject to the verify test. The memory cells in the temporary lockout mode are therefore subject to the verify test a second time. Memory cells that fail the verify test in the checkpoint program-verify iteration are programmed further. A normal or slow programming mode is used for a memory cell depending on whether it had reached the temporary lockout mode. Threshold voltage distributions are narrowed by reprogramming some of the memory cells.

19 Claims, 18 Drawing Sheets

(56) References Cited

U.S. PATENT DOCUMENTS

| | | | |
|---|---|---|---|
| 8,503,233 | B2 | 8/2013 | Huang et al. |
| 8,988,937 | B2* | 3/2015 | Dunga et al. ............. 365/185.02 |
| 2006/0291290 | A1 | 12/2006 | Kim et al. |
| 2007/0183208 | A1 | 8/2007 | Tanaka et al. |
| 2007/0279989 | A1 | 12/2007 | Aritome |
| 2009/0003075 | A1 | 1/2009 | Kim et al. |
| 2009/0219761 | A1 | 9/2009 | Moschiano et al. |
| 2012/0170374 | A1 | 7/2012 | Im et al. |
| 2013/0138882 | A1 | 5/2013 | Shaeffer et al. |
| 2013/0322174 | A1 | 12/2013 | Li et al. |
| 2014/0119126 | A1* | 5/2014 | Dutta et al. ............. 365/185.19 |
| 2014/0219027 | A1* | 8/2014 | Dong et al. ............. 365/185.17 |
| 2015/0070998 | A1* | 3/2015 | Dong et al. ............. 365/185.17 |

OTHER PUBLICATIONS

Lee, Myoung-Sun, et al., "A Subthreshold Slope and Low-frequency Noise Characteristics in Charge Trap Flash Memories With Gate-All-Around and Planar Structure," Journal of Semiconductor Technology and Science, vol. 12, No. 3, Sep. 2012, 10 pages.

Seidel, K., et al., "Impact of the Storage Layer Charging on Random Telegraph Noise Behavior of sub-50nm Charge-Trap-Based TANOS and Floating-Gate Memory Cells," IEEE International Integrated Reliability Workshop Final Report, Oct. 2010, 4 pages.

U.S. Appl. No. 14/053,856, filed Oct. 15, 2013.

International Search Report & the Written Opinion of the International Searching Authority dated Jul. 6, 2015, International Application No. PCT/US2015/024589.

* cited by examiner

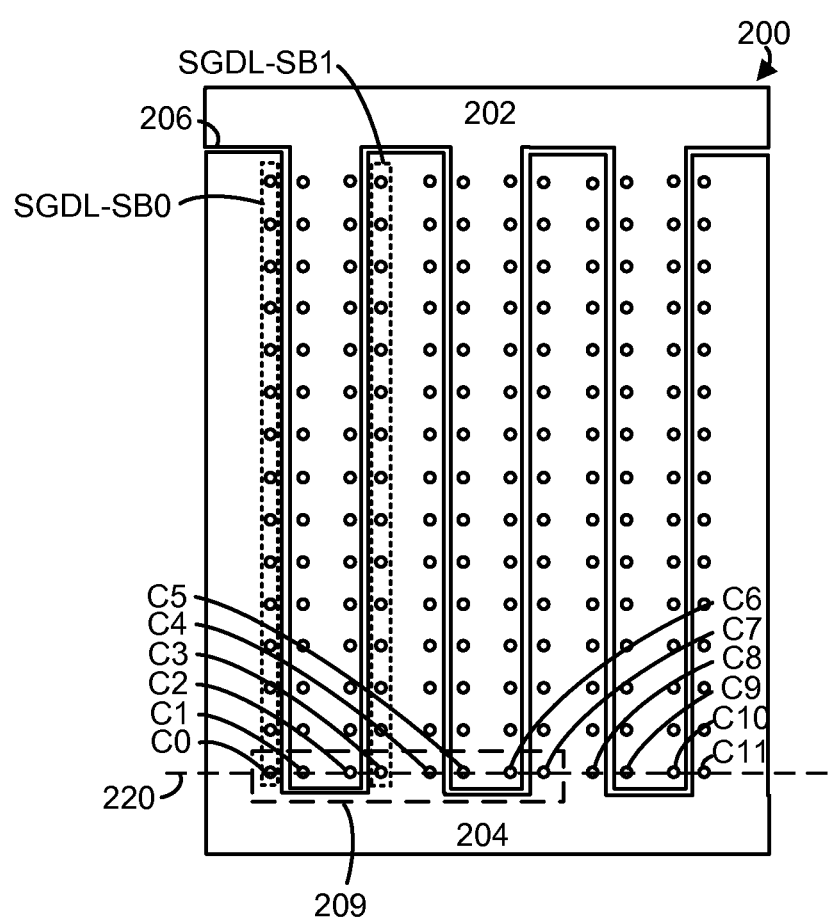

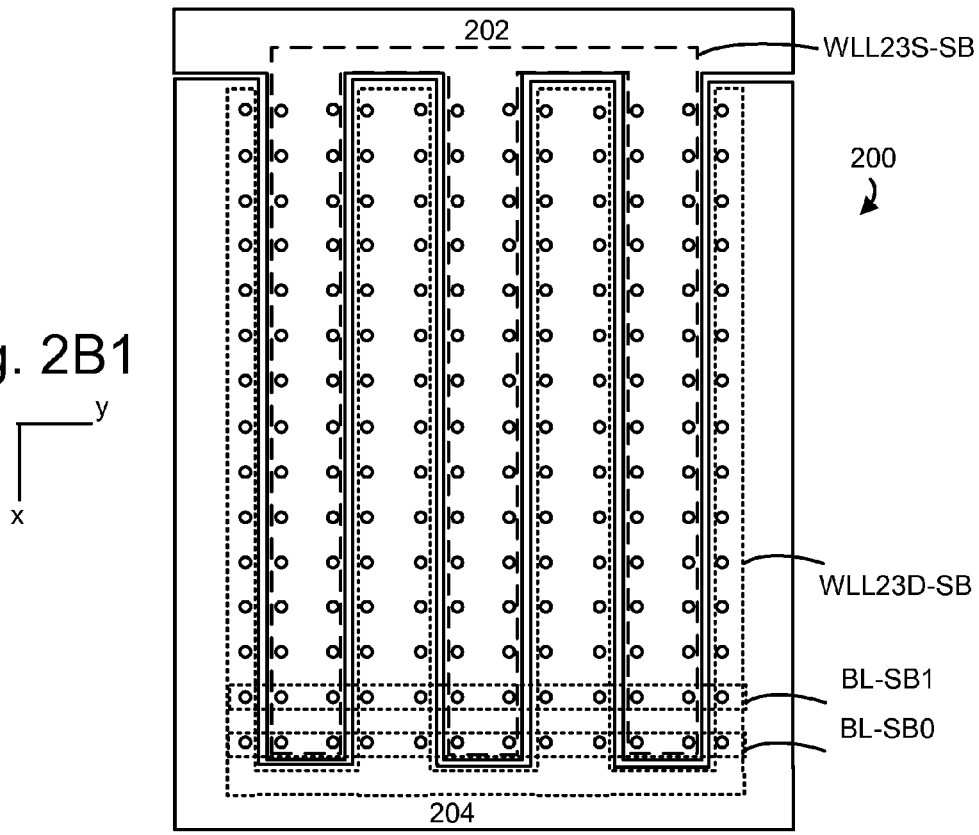
Fig. 2B1
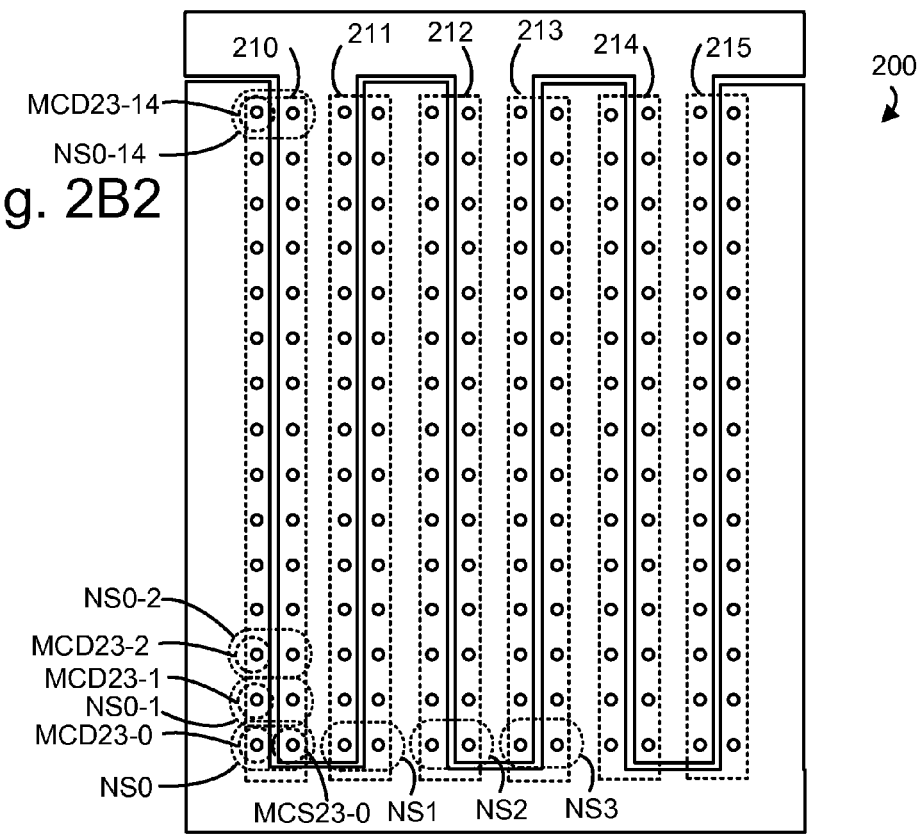
Fig. 2B2

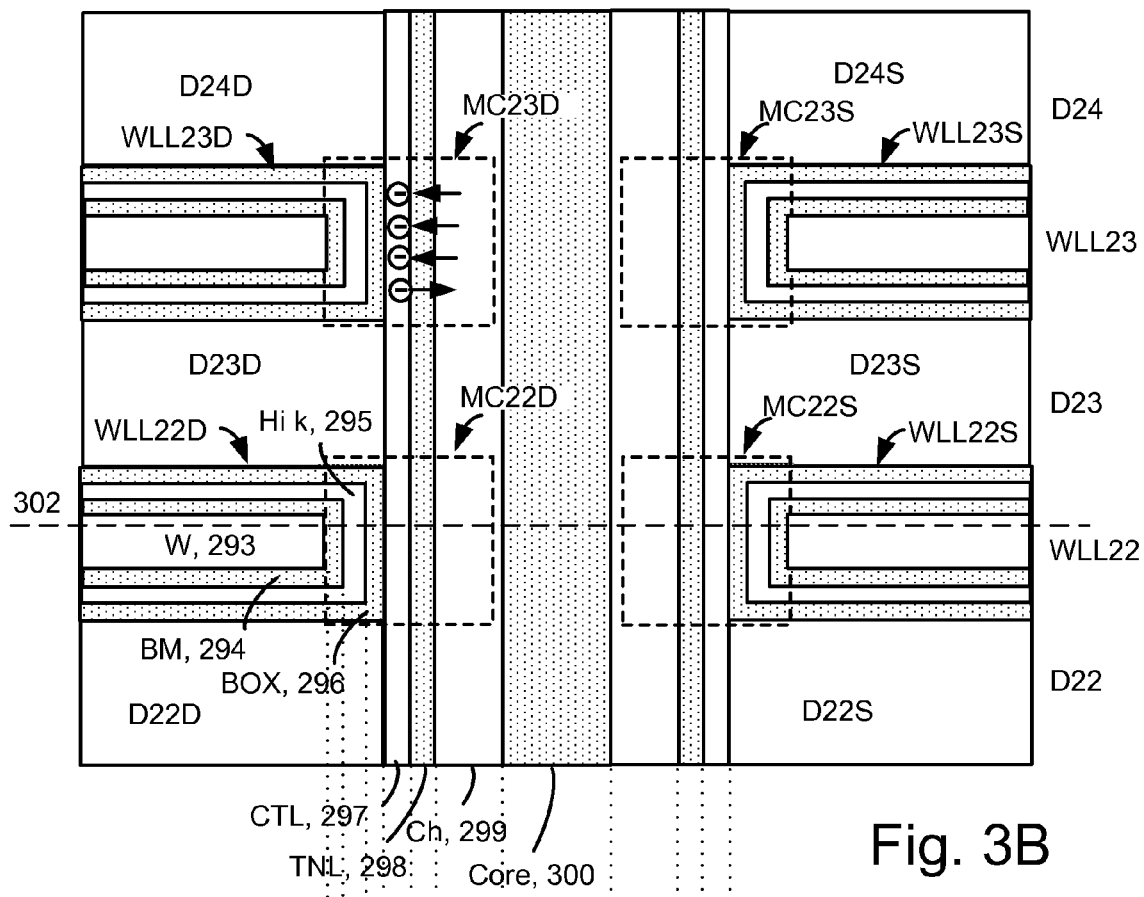
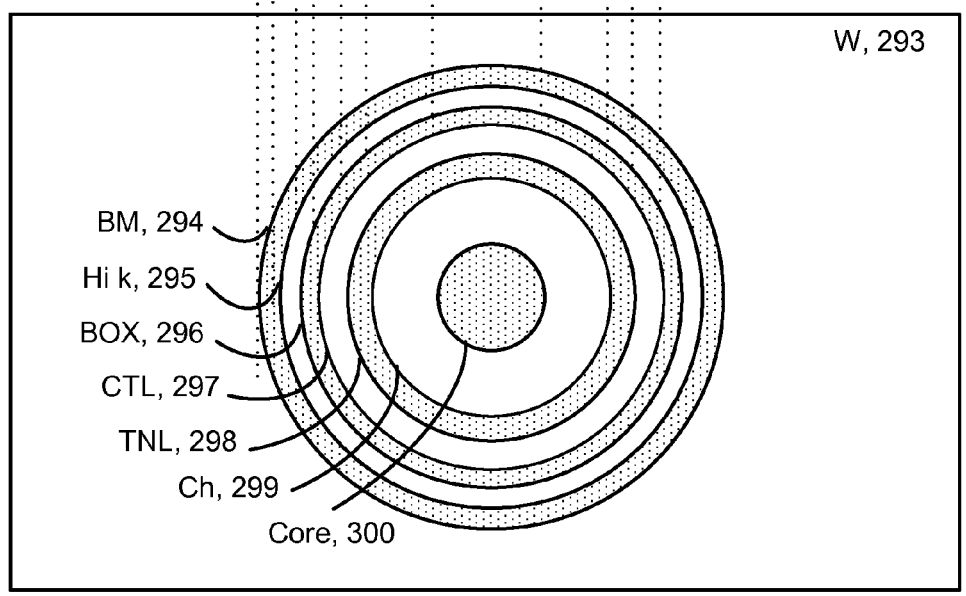

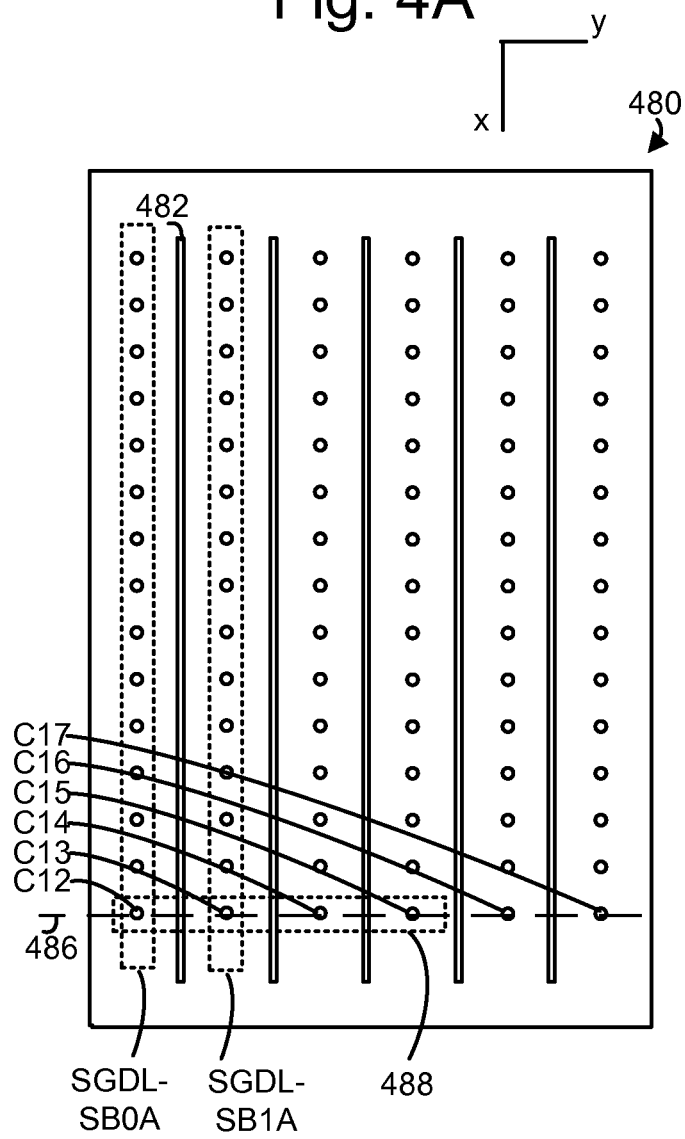

Fig. 4B1
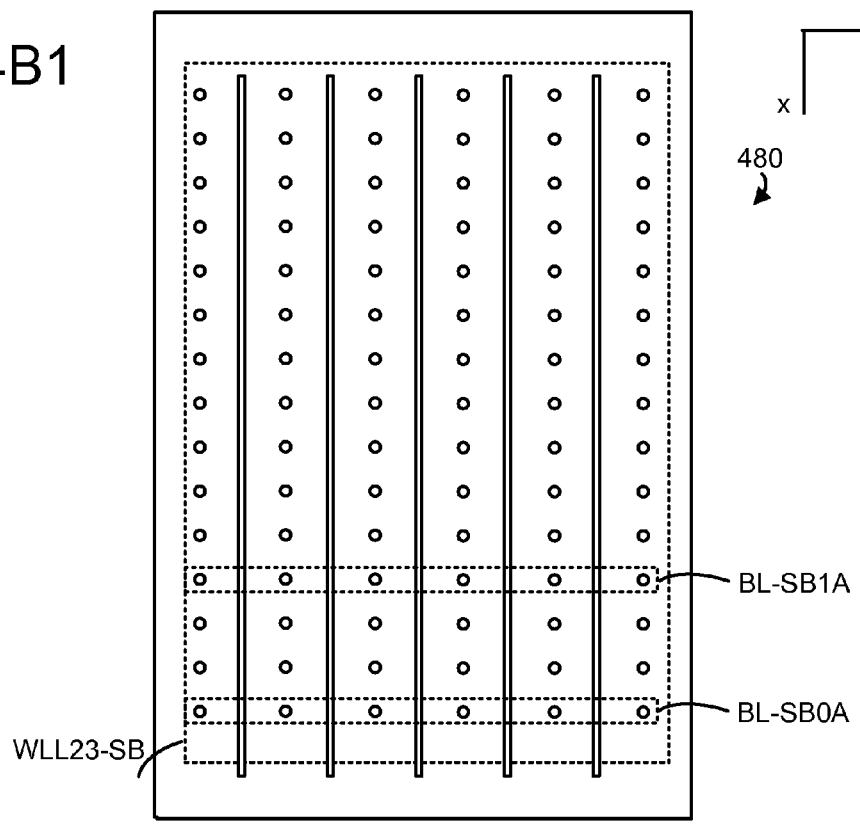
Fig. 4B2
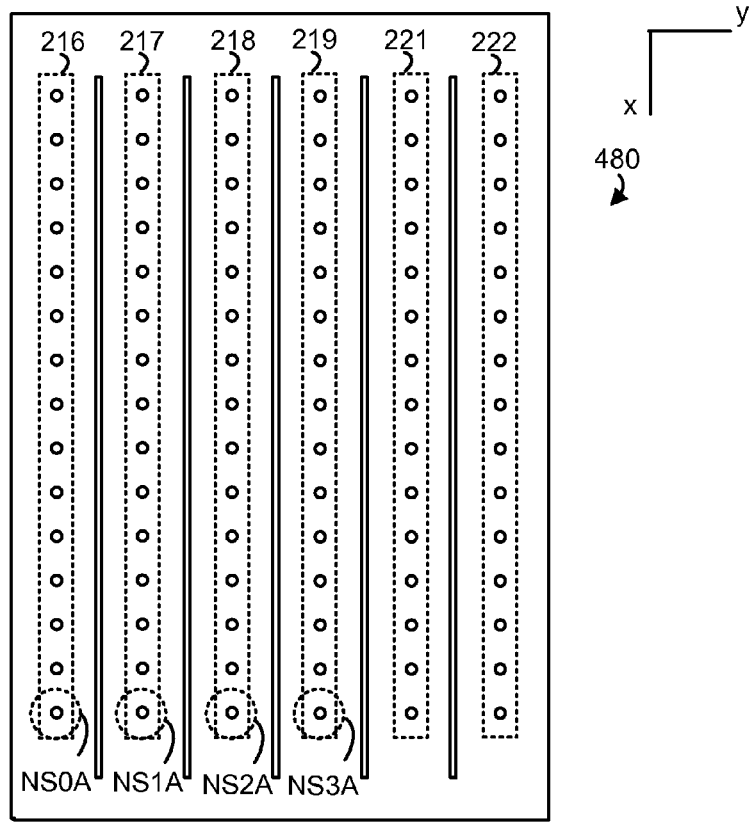

Fig. 10A

E state, or A. B or C state in permanent lockout

LDL: 1
UDL: 1
VDL: x

Fig. 10B

A state initially

LDL: 0
UDL: 1
VDL: 0

Fig. 10C

A state passed verify test before checkpoint

LDL: 0
UDL: 1
VDL: 1

Fig. 10D

B state initially

LDL: 0
UDL: 0
VDL: 0

Fig. 10E

B state passed verify test before checkpoint

LDL: 0
UDL: 0
VDL: 1

Fig. 10F

C state initially

LDL: 1
UDL: 0
VDL: 0

Fig. 10G

C state passed verify test before checkpoint

LDL: 1
UDL: 0
VDL: 1

EFFICIENT REPROGRAMMING METHOD FOR TIGHTENING A THRESHOLD VOLTAGE DISTRIBUTION IN A MEMORY DEVICE

BACKGROUND

The present technology relates to techniques for programming memory cells.

Recently, ultra high density storage devices have been proposed using a three-dimensional (3D) stacked memory structure sometimes referred to as a Bit Cost Scalable (BiCS) architecture. For example, a 3D NAND stacked memory device can be formed from a stack of alternating conductive and dielectric layers. A memory hole is formed in the layers to define many memory layers simultaneously. A NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 3A depicts a close-up view of the region 236 of the column C0 of FIG. 2C, showing example memory cells MC23D, MC22D, MC23S and MC22S.

FIG. 3B depicts a cross-sectional view along line 302 of FIG. 3A.

FIG. 4A depicts a top view of a straight NAND string embodiment (block 480) of the block BLK0 of FIG. 1A, showing example SGD line subsets SGDL-SB0A and SGDL-SB1A.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 7A depicts a Vth distribution of memory cells at a start of the programming operation.

FIG. 7B depicts a Vth distribution of memory cells after programming of a lower page of data in a first programming pass.

FIG. 7C depicts a Vth distribution of memory cells after programming of an upper page of data in a second programming pass.

FIG. 10A depicts a bit combination in a set of latches for a memory cell which is to remain in the erased state, or which is in a permanent lockout mode, consistent with the programming process of FIG. 5C.

FIG. 10B depicts an initial bit combination in a set of latches for a memory cell which is to be programmed to the A state, consistent with step 561A of FIG. 5C.

FIG. 10C depicts a bit combination in a set of latches for a memory cell which is to be programmed to the A state, after passing a verify test before the A state checkpoint of step 563 of FIG. 5C.

FIG. 10D depicts an initial bit combination in a set of latches for a memory cell which is to be programmed to the B state, consistent with step 561A of FIG. 5C.

FIG. 10E depicts a bit combination in a set of latches for a memory cell which is to be programmed to the B state, after passing a verify test before the B state checkpoint of step 565 of FIG. 5C.

FIG. 10F depicts an initial bit combination in a set of latches for a memory cell which is to be programmed to the C state, consistent with step 561A of FIG. 5C.

FIG. 10G depicts a bit combination in a set of latches for a memory cell which is to be programmed to the C state, after passing a verify test before the C state checkpoint of step 567 of FIG. 5C.

DETAILED DESCRIPTION

Figure 1A:
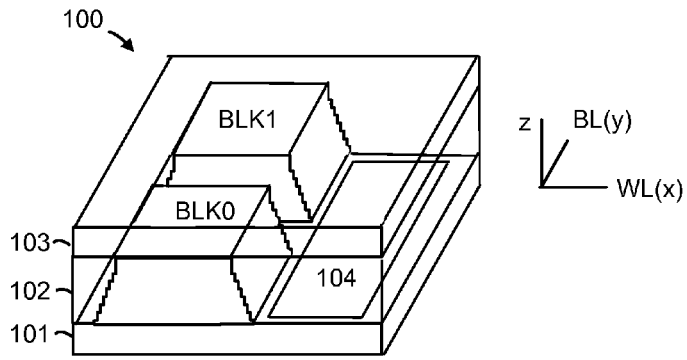
FIG. 1A is a perspective view of a 3D stacked non-volatile memory device.

Techniques are provided for programming memory cells which are subject to charge detrapping, e.g., loss of charge from a charge-trapping layer of a memory cell.

Charge-trapping memory cells store a charge in a charge-trapping layer such as SiN or other nitride. For example, an oxide-nitride-oxide (O—N—O) configuration may be used.

Charge-trapping memory cells can be used in 2D and 3D memory devices. However, short term data-retention loss can be significant in such memory cells. This loss is caused by charge detrapping from shallow traps in the tunnel ONO layers of the memory cells, and can occur very quickly after a programming voltage is applied. Some amount of the detrapping may occur after a programming voltage is applied and before a verify operation is performed. In this case, the memory cell will require one or more programming pulses to pass the verify test. However, a significant amount of detrapping occurs after the verify operation is performed. In this case, a memory cell may pass a verify test and be locked out from further programming before significant detrapping occurs. As a result, its threshold voltage will be significantly lower when the memory cell is later read. This results in an overall downshift of the threshold voltages of a set of memory cells and broadens the threshold voltage (Vth) distribution. For example, the lower tail of the Vth distribution for each data state may drop by about 0.5-0.8 V below the verify level. Charge-trapping memory cells are particularly susceptible to detrapping as compared to floating gate memory cells.

One approach is to program the memory cells to the same verify levels in two programming passes. In this case, the memory cells which suffered from a fast charge loss during the first programming pass have a second chance to be programmed. This approach pushes up the lower tail of the Vth distribution so that the Vth distribution becomes narrower. However, programming time is nearly doubled.

Techniques provided herein reduce the effects of detrapping and thereby reduce downshift and broadening of the Vth distribution, while avoiding an increase in programming time. In one aspect, an initial number of program-verify iterations are performed in which a temporary lockout state is provided for memory cells which reach a verify level relatively quickly in a programming pass. Subsequently, a checkpoint program-verify iteration is performed in which all of the memory cells which have a common target data state are subject to the verify test, including the memory cells which previously passed the verify test. Any memory cell which does not pass the verify test during the checkpoint program-verify iteration is subject to one or more additional program-verify iterations in the programming pass until the verify test is passed. This approach results in reprogramming of some memory cells so that the effects of detrapping are overcome. Further, by using the same verify level for the initial programming, the checkpoint program-verify iteration and the subsequent programming, the programming time is not increased by the use of a separate verify test.

Latches associated with the memory cells can be configured to indicate whether a memory cell has passed the verify test during the initial programming. A memory cell which has passed the verify test during the initial programming but not during the checkpoint program-verify iteration can be treated differently in the subsequent programming than a memory cell which has failed the verify test during the initial programming and the checkpoint program-verify iteration. For example, a slow programming mode (e.g., using an elevated voltage applied to a bit line associated with the memory cell) can be used for a memory cell which has passed the verify test during the initial programming but not during the checkpoint program-verify iteration. In another approach, a slow programming mode can be used for the memory cells which failed the checkpoint program-verify iteration regardless of whether they passed the verify test during the initial programming.

Advantages of the above-mentioned techniques include reducing downshifting and broadening of the Vth distribution of a set of memory cells due to detrapping.

The following discussion provides details of the construction of a memory device and of related programming and sensing techniques which address the above-mentioned issues.

FIG. 1A is a perspective view of a 3D stacked non-volatile memory device. As mentioned, one example of a charge-trapping memory device is a 3D memory device in which the memory cells are arranged in a 3D structure.

The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
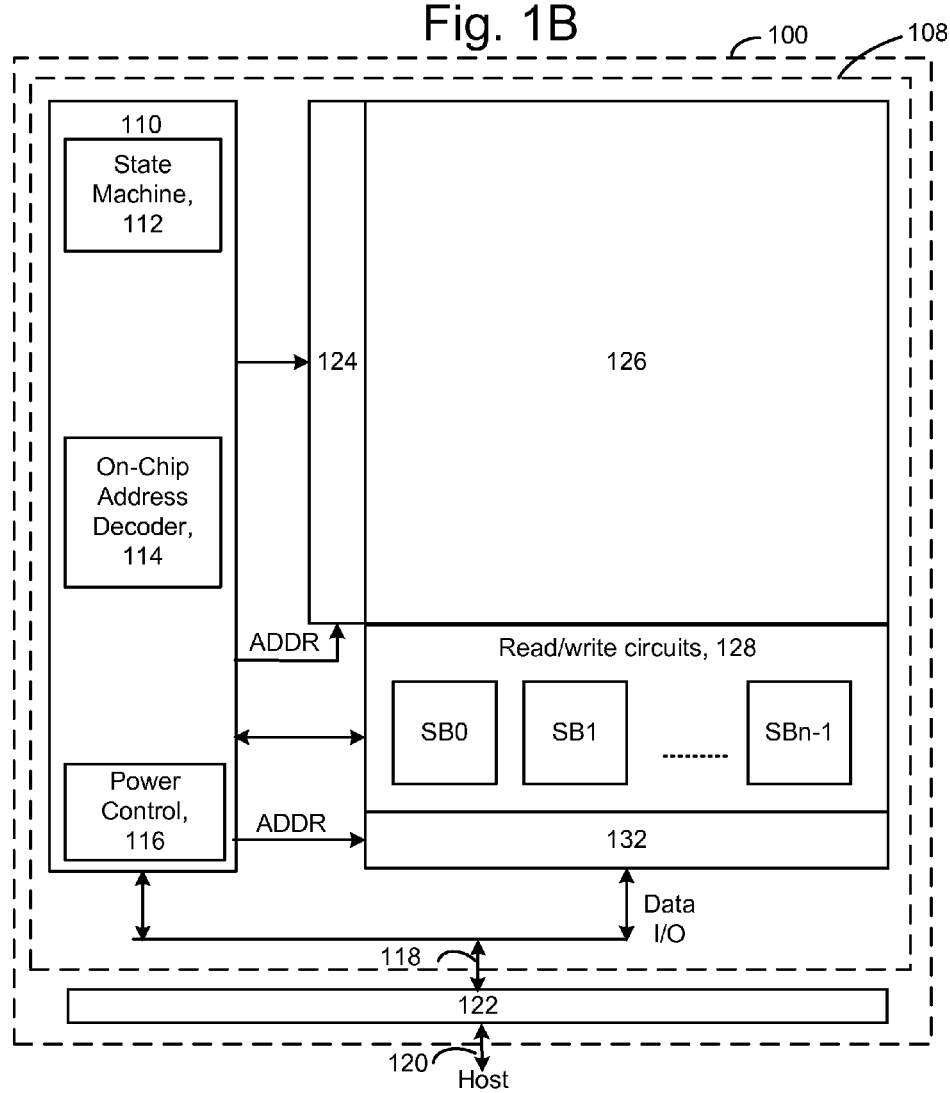
FIG. 1B is a block diagram of a memory device which can be used to provide a 3D stacked non-volatile memory device such as depicted in FIG. 1A or a 2D memory device such as depicted in FIG. 5A.
Figure 5A:
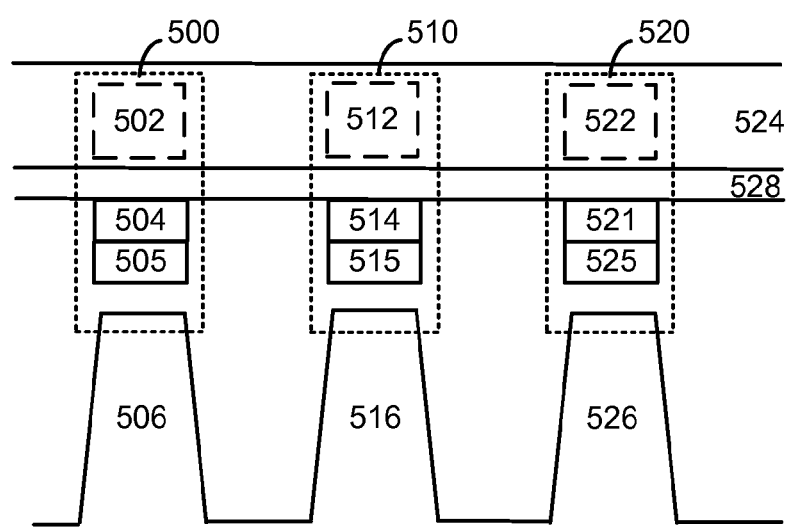
FIG. 5A depicts a cross-sectional view of memory cells comprising a flat control gate and charge-trapping regions as another example of memory cells in the memory structure 126 of FIG. 1B.

FIG. 1B is a block diagram of a memory device which can be used to provide a 3D stacked non-volatile memory device such as depicted in FIG. 1A or a 2D memory device such as depicted in FIG. 5A. The memory device 100 may include one or more memory die 108. The memory die 108 includes memory structure 126 of memory cells (e.g., including the blocks BLK0 and BLK1), control circuitry 110, and read/write circuits 128. The memory structure 126 is addressable by word lines via a row decoder 124 and by bit lines via a column decoder 132. The read/write circuits 128 include multiple sense blocks SB0, SB1, . . . , SBn-1 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via data bus 120 and between the controller and the one or more memory die 108 via lines 118.

The memory structure may comprise one or more array of memory cells including a 2D or a 3D array. The memory structure may comprise a monolithic three dimensional memory array in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs, drain- and source-side select gate drivers (referring, e.g., to drain- and source-sides or ends of a string of memory cells such as a NAND string, for instance) and source lines. The sense blocks can include bit line drivers, in one approach.

In some implementations, some of the components can be combined. In various designs, one or more of the components (alone or in combination), other than memory structure 126, can be thought of as at least one control circuit or as control circuitry. For example, a control circuit may include any one of, or a combination of, control circuitry 110, state machine 112, decoders 114/132, power control module 116, sense blocks (SB0, including the processor 192 and managing circuit MC0 in FIG. 1C), read/write circuits 128, and controller 122, and so forth. The sense block SB0 is discussed further in connection with FIG. 1C.

In another approach, a non-volatile memory system uses dual row/column decoders and read/write circuits. Access to the memory structure by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory structure 126. In this way, the density of the read/write modules is reduced by one half.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 1C:
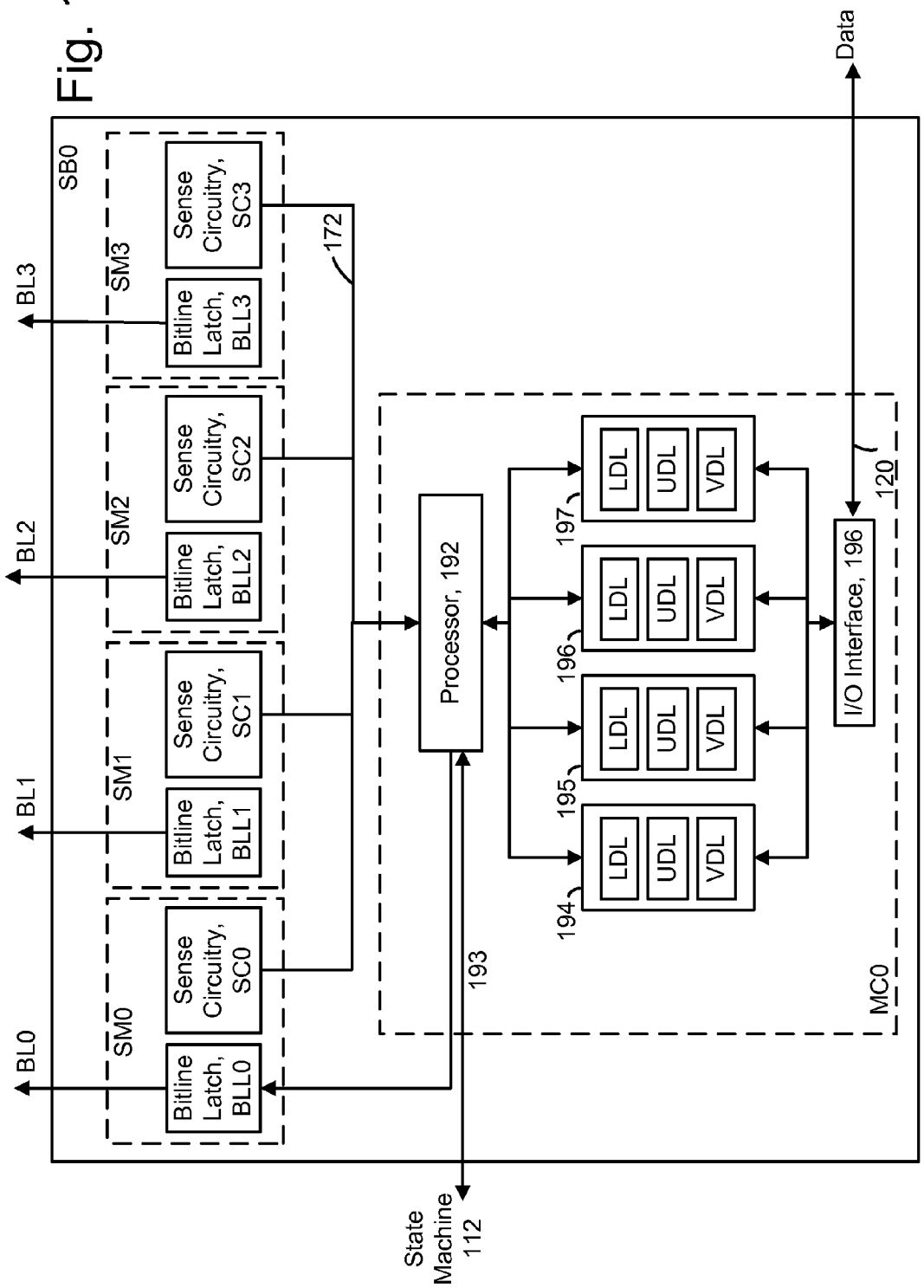
FIG. 1C is a block diagram depicting one embodiment of the sense block SB0 of FIG. 1B.

FIG. 1C is a block diagram depicting one embodiment of the sense block SB0 of FIG. 1B. The sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify level). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 196 coupled between the sets of data latches and a data bus 120. One set of data latches can be provide for each sense module, and may include data latches identified by LDL, UDL and VDL. LDL stores a bit for a lower page (LP) of write data, and UDL stores a bit for an upper page (UP) of write data, in a memory which stores two bits of data in each memory cell. VDL stores a verify data bit as discussed further below, which identifies a memory cell which is in, or has been in, a temporary lockout state, in a programming pass.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations.

The processor 192 performs computations during reading and programming. For reading, the processor determines the data state stored in the sensed memory cell and stores the data in the set of data latches. For programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrA, VrB and VrC in FIG. 6B) corresponding to the various memory states supported by the memory (e.g., states A, B and C), the sense module may trip at one of these voltages and a corresponding output will be provided from the sense module to the processor 192 via the bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses (see FIG. 8) applied to the control gates of the addressed memory cells. Each programming voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit. This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated memory cell has reached certain mileposts in a programming operation. For example, data latches may identify that the Vth of a memory cell is below a particular verify level. The data latches indicate whether a memory cell currently stores one or more bits from a page of data. For example, an LP data latch is flipped (e.g., from 0 to 1) when a lower page bit is stored in an associated memory cell. An UP data latch is flipped when an upper page bit is stored in an associated memory cell. The flipping of a bit occurs when an associated memory cell completes programming, e.g., when its Vth exceeds a target verify level. See FIG. 10A-10G. When lower, middle and upper page bits are used (e.g., in case of three-bit per memory cell memory), the MP data latch is also flipped when a middle page bit is stored in an associated memory cell. Additional information regarding the setting of bit combinations in the data latches is discussed further below.

Figure 2C:
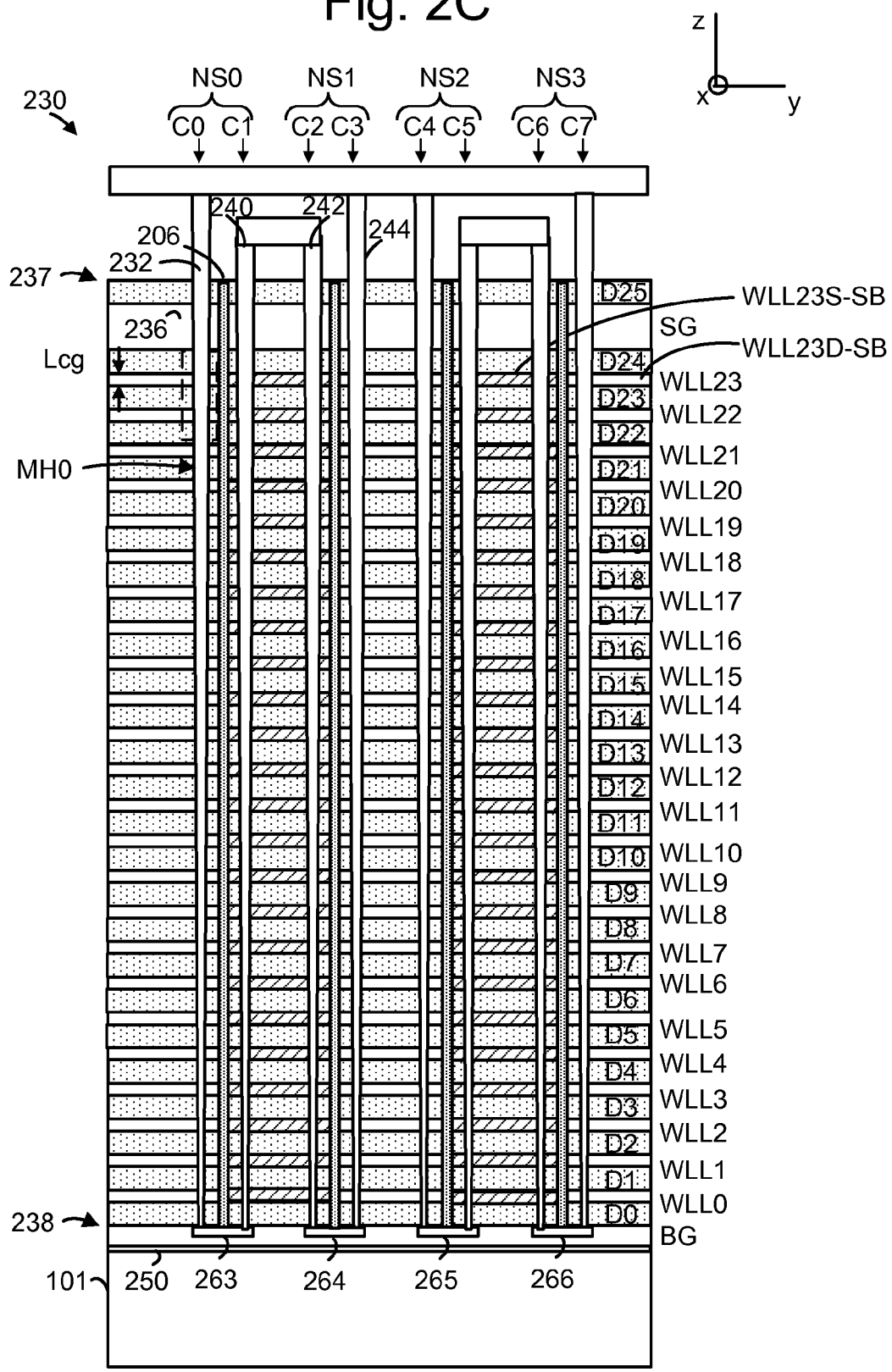
FIG. 2C depicts an embodiment of a stack 230 showing a cross-sectional view of the portion 209 of the block 200 of FIG. 2A, along line 220.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2C, the stack includes alternating dielectric and conductive layers. The dielectric layers include D0 to D25 and may be made of SiO2, for instance. The conductive layers include BG, which is a back gate layer, WLL0 to WLL23, which are conductive paths to control gates of the memory cells at the layer, and SG, which is a select gate layer, e.g., a conductive path to control gates of select gate transistors of NAND strings. FIG. 2A may represent any one of WLL0 to WLL23, for instance, in an example with twenty-four WLLs. The conductive layers may include doped polysilicon, metal silicide or a metal, for instance. An example voltage of 5-10 V may be applied to the back gate to maintain a conductive state which connects the drain- and source-side columns.

For each block, the WLL is divided into two portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2C.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one memory cell in the source-side of each U-shaped NAND string, and WLL23D-SB is a WLL portion in communication with one memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the WLL portions 202 and 204.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set. Sets of NAND strings 210-215 are also depicted.

FIG. 2B2 depicts the block 200 FIG. 2A, showing example sets of NAND strings 210-215. The set of NAND strings 210 includes an example NAND string NS0, such as depicted in FIG. 2B5 and example memory cells MCD23-0, MCD23-1, MCD23-2, . . . , MCD23-14, as depicted in FIG. 2B6. In this notation, "MC" denotes a memory cell, "D" denotes a drain side of the NAND strings, and the number (0, 1, 2, . . . , 14) denotes a number of the NAND string based on its position in the stack. NAND strings NS0, NS0-1, NS0-2, . . . , NS0-14 are also depicted.

FIG. 2C depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0, corresponding to C0, is depicted for reference. The memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs. Each word line layer provides a word line.

The source line SL0 is connected to the source ends 240 and 242 of two adjacent memory strings NS0 and NS1. SL0 is also connected to other sets of memory strings which are behind NS0 and NS1 in the x direction. Additional U-shaped NAND strings in the stack 230 (e.g., NS0-1, NS0-2, . . . , NS0-14 from FIG. 2B6) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

A region 236 of the stack is shown in greater detail in FIG. 3A.

Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B1. In each WLL, the diagonal line patterned region represents the source-side sub-block, and the unpatterned region represents the drain-side sub-block.

FIG. 3A depicts a close-up view of the region 236 of the column C0 of FIG. 2C, showing example memory cells MC23D, MC22D, MC23S and MC22S. The region also shows portions D24D and D24S of the dielectric layer D24, portions D23D and D23S of the dielectric layer D23, and portions D22D and D22S of the dielectric layer D22. The region also shows portions WLL24D and WLL24S of the conductive layer WLL24, portions WLL23D and WLL23S of the conductive layer WLL23, and portions WLL22D and WLL22S of the conductive layer WLL22.

A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 297 such as SiN or other nitride, a tunnel oxide (TNL) 298, a polysilicon body or channel (CH) 299, and a core filler dielectric 300. The word line layer includes a block oxide (BOX) 296, a block high-k material 295, a barrier metal 294, and a conductive metal such as W 293. In another approach, all of these layers except the W are provided in the column. Additional memory cells are similarly formed throughout the columns.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge.

Each respective memory cell of the first set of memory cells is adjacent to, and is arranged along a common charge-trapping layer with, a respective memory cell of the second set of memory cells. For example, MC23D is adjacent to, and is arranged along a common charge-trapping layer 297 with, MC22D. Also, MC23S is adjacent to, and is arranged along a common charge-trapping layer 297 with, MC22S.

Circles in the CTL represent charges (electrons) in MC23D. The arrows pointing to the left indicate charges which are drawn into the CTL and the arrow pointing to the right indicates a charge which is detrapped out of the CTL.

FIG. 3B depicts a cross-sectional view along line 302 of FIG. 3A. Each layer is ring-shaped in one possible approach, except the core filler, which is a cylinder.

Figure 3C:
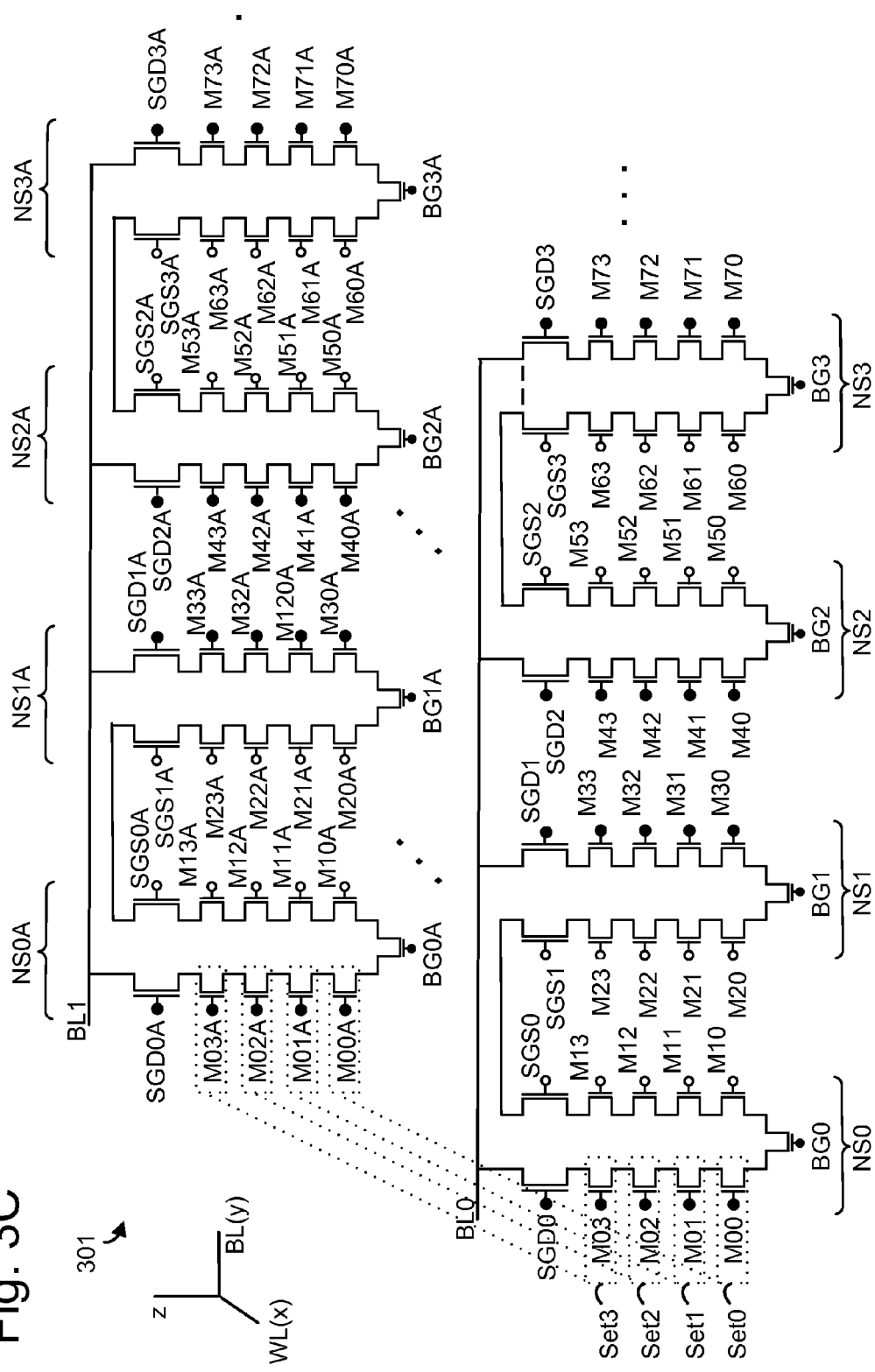
FIG. 3C depicts one embodiment of a circuit 301 in a 3D stacked non-volatile memory device.

FIG. 3C depicts one embodiment of a circuit 301 in a 3D stacked non-volatile memory device. As a simplification, four memory cells are provided per column.

NAND strings NS0, NS1, NS2 and NS3 are in communication with a bit line BL0, and NAND strings NS0A, NS1A, NS2A and NS3A are in communication with a bit line BL1. In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

A sets of memory cells includes cells that can be programmed or read together. For example, a set of memory cells can include cells connected to a common word line layer (WLL) portion and to a common SGD line. For example, Set0 includes cells M00-M00A, Set1 includes cells M01-M01A, Set2 includes cells M02-M02A, and Set3 includes cells M03-M03A. See also FIG. 12.

At each level of the circuit, the control gates of the drain-side memory cells are connected to one another by a common WLL. For example, at the top WLL, M03, M03A, M33, M33A, M43, M43A, M73 and M73A have control gates connected by a word line layer. Similarly, the control gates of the source-side memory cells are connected to one another by a common WLL. For example, at the top WLL, M13, M13A, M23, M23A, M53, M53A, M63 and M63A have control gates connected by a word line layer.

Additionally, control gates of the SGD transistors are connected to one another. For example, control gates of SGD0, . . . , SGD0A are connected, control gates of SGD1, . . . , SGD1A are connected, control gates of SGD2, . . . , SGD2A are connected, and control gates of SGD3, . . . , SGD3A are connected.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

FIG. 4A depicts a top view of a straight NAND string embodiment (block 480) of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one WLL which is connected to each of the memory cells of the layer.

Figure 4C:
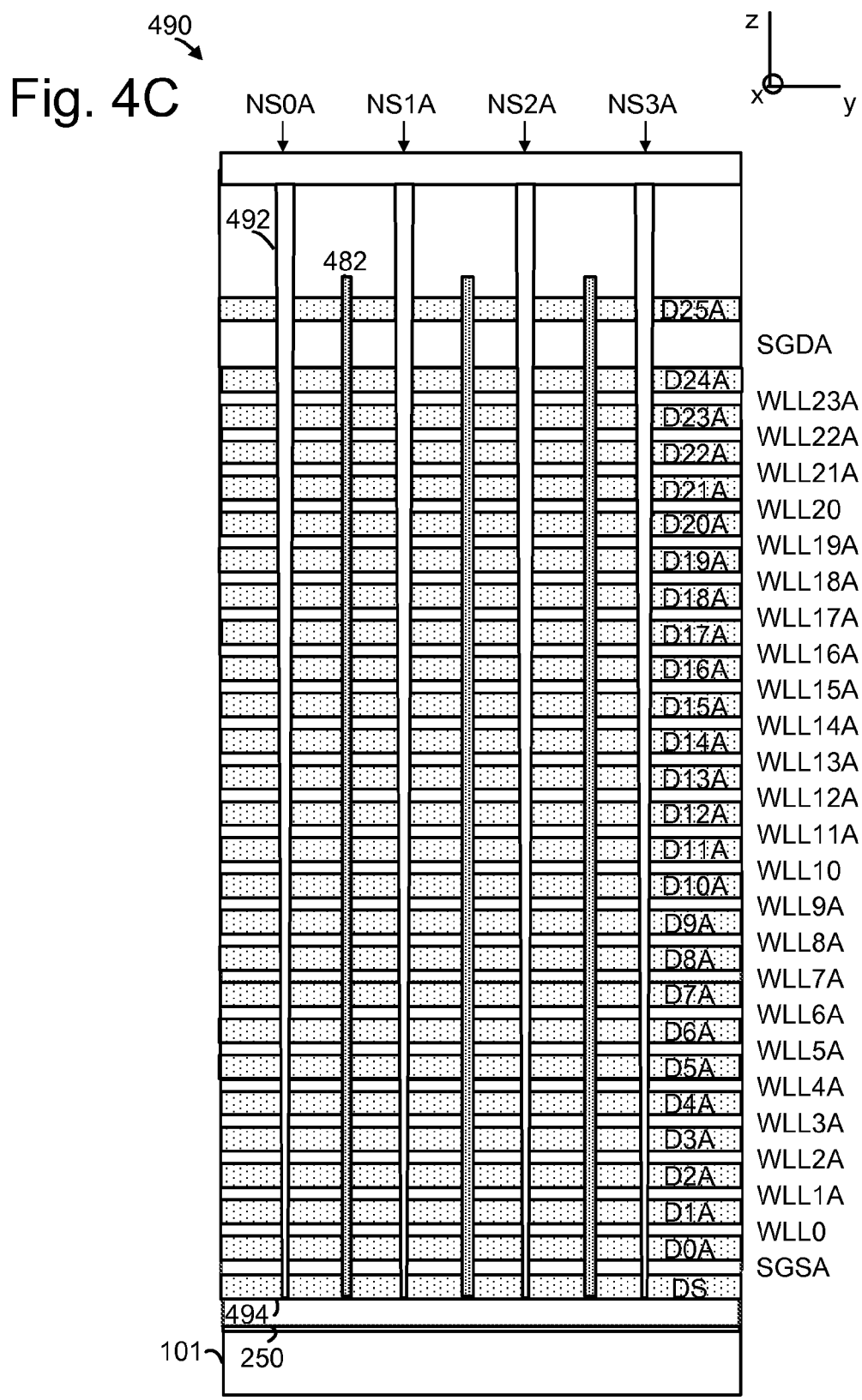
FIG. 4C depicts a cross-sectional view of the portion 488 of the block 480 of FIG. 4A along line 486.

For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216, 217, 218, 219, 221 and 222. Example NAND strings NS0A-NS3A in the portion 488 are also depicted.

FIG. 4C depicts a cross-sectional view of the portion 488 of the block 480 of FIG. 4A along line 486. Columns of memory cells corresponding to NAND strings NS0A-NS3A in FIG. 4B2 are depicted in the multi-layer stack. In the portion, a stack 490 which includes a substrate 101, an insulating film 250 on the substrate, and a portion of a source line SL0A.

Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

FIG. 5A depicts a cross-sectional view of memory cells comprising a flat control gate and charge-trapping regions as another example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521 and polysilicon layers 505, 515 and 525.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

The flat control gate is used instead of a control gate that wraps around a floating gates. One advantage is that the charge-trapping layer can be made thinner than a floating gate. Additionally, the memory cells can be placed closer together.

Figure 5B:
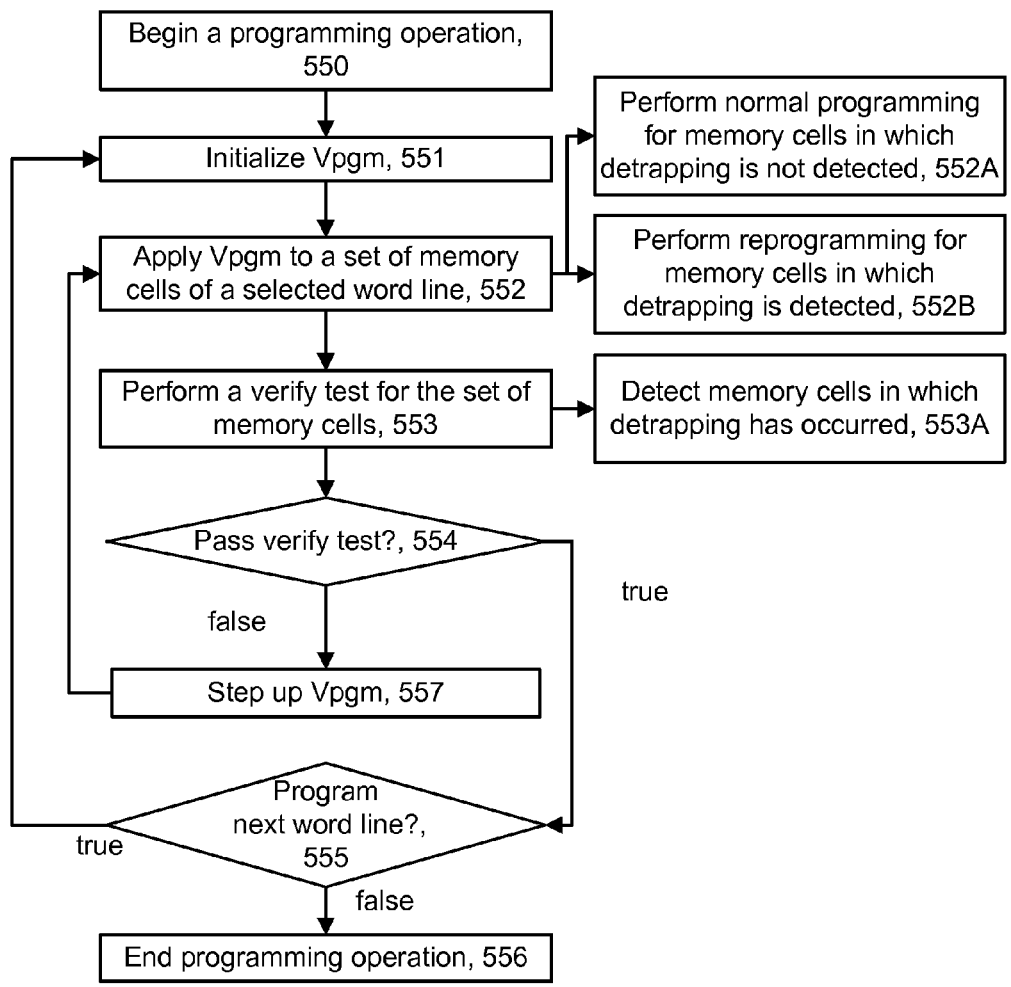
FIG. 5B depicts a process for programming memory cells in a memory device.
Figure 6A:
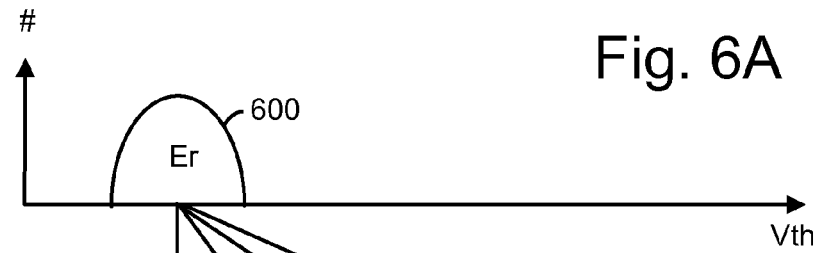
FIGS. 6A and 6B depict a one pass programming operation with four data states as an example of the programming pass of FIG. 5C.
Figure 6B:
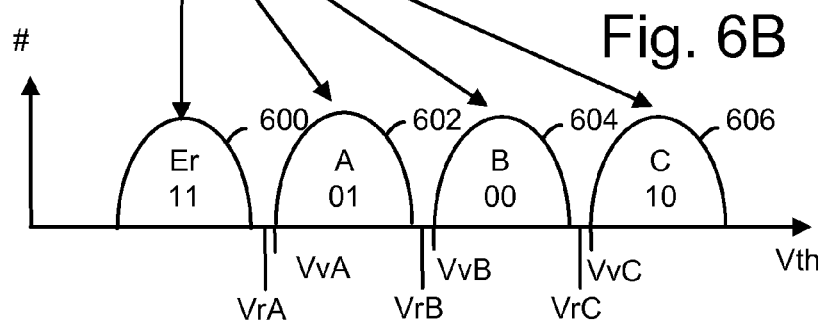
Figure 7A:
FIGS. 7A to 7C depict a two-pass programming operation with four data states as another example of the programming pass of FIG. 5C.
Figure 7B:
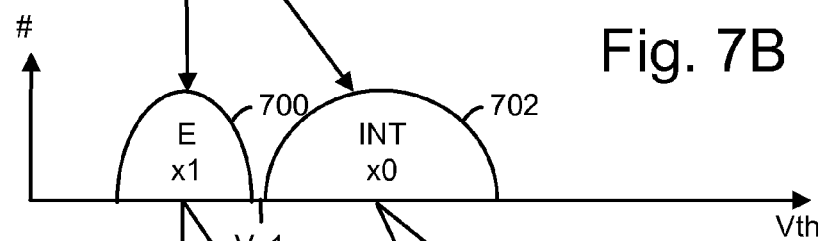
Figure 7C:
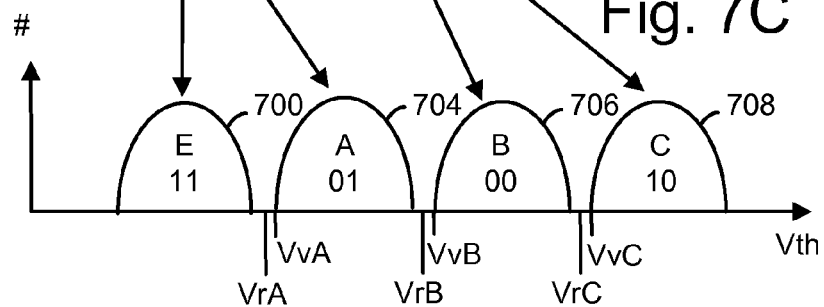

FIG. 5B depicts a process for programming memory cells in a memory device. A programming operation begins at step 550. A programming operation can involve one or more programming passes. FIGS. 6A and 6B provide an example of a single-pass programming operation while FIG. 7A-7C provides an example of a two-pass programming operation. In some cases, a page of data is programmed into a set of memory cells in a programming pass.

The set of memory cells may be connected to a common word line. Step 551 includes initializing a programming voltage Vpgm. See FIG. 8, which depicts, Vpgm_initial, as an initial value of Vpgm. Step 552 involves applying Vpgm to a set of memory cells on a selected word line. The memory cells are programmed while Vpgm is applied. This can include performing normal programming for memory cells in which detrapping is not detected (step 552A) and performing reprogramming for memory cells in which detrapping is detected (step 552B). Normal programming can include programming of a memory cell until its threshold voltage first reaches a verify level of a target data state. Reprogramming can include programming of a memory cell until its threshold voltage reaches a verify level of a target data state a second time, after the threshold voltage had previously reached the verify level a first time. Additionally, the reprogramming can occur in a slow programming mode in which a bit line voltage is set at an elevated level during a programming voltage so that the programming speed is reduced, as discussed further below.

Step 553 includes performing a verify test for the set of memory cells. For example, sensing circuitry which is connected to the bit lines can be used to sense a conductive or non-conductive state of the memory cells when a control gate voltage of VvA, VvB or VvC is applied to the word line. See also FIG. 1C. A cell which is in a non-conductive state has passed a verify test and is provided in a temporary or permanent lockout state, as described in connection with FIG. 5C. The verify test can involve detecting memory cells in which detrapping as occurred (step 553A). For example, this can involve detecting memory cells that pass a verify test a first time and later fail the verify test in a programming pass.

Decision step 554 determines whether the set of memory cells has passed the verify test. Typically, this requires that all, or almost all of the memory cells have passed their respective verify tests. For example, this can involve verifying the memory cells of each target data state relative to a verify level of the target data state. If decision step 554 is false, programming of the set of memory cells in the programming pass is not complete. Vpgm is stepped up at step 557 and a next programming pulse is applied at step 552. In one approach, a fixed step size can be used throughout the programming pass. In another approach, the step size can be reduced at specified program-verify iterations. See FIG. 11B. If decision step 554 is true, programming of the set of memory cells in the programming pass is complete and decision step 555 determines whether there is a next word line to program. If decision step 555 is false, the programming operation has ended at step 556. If decision step 555 is true, a program pass is performed for the next word line. Vpgm is initialized at step 551 and a next programming pulse is applied at step 552.

Figure 5C:
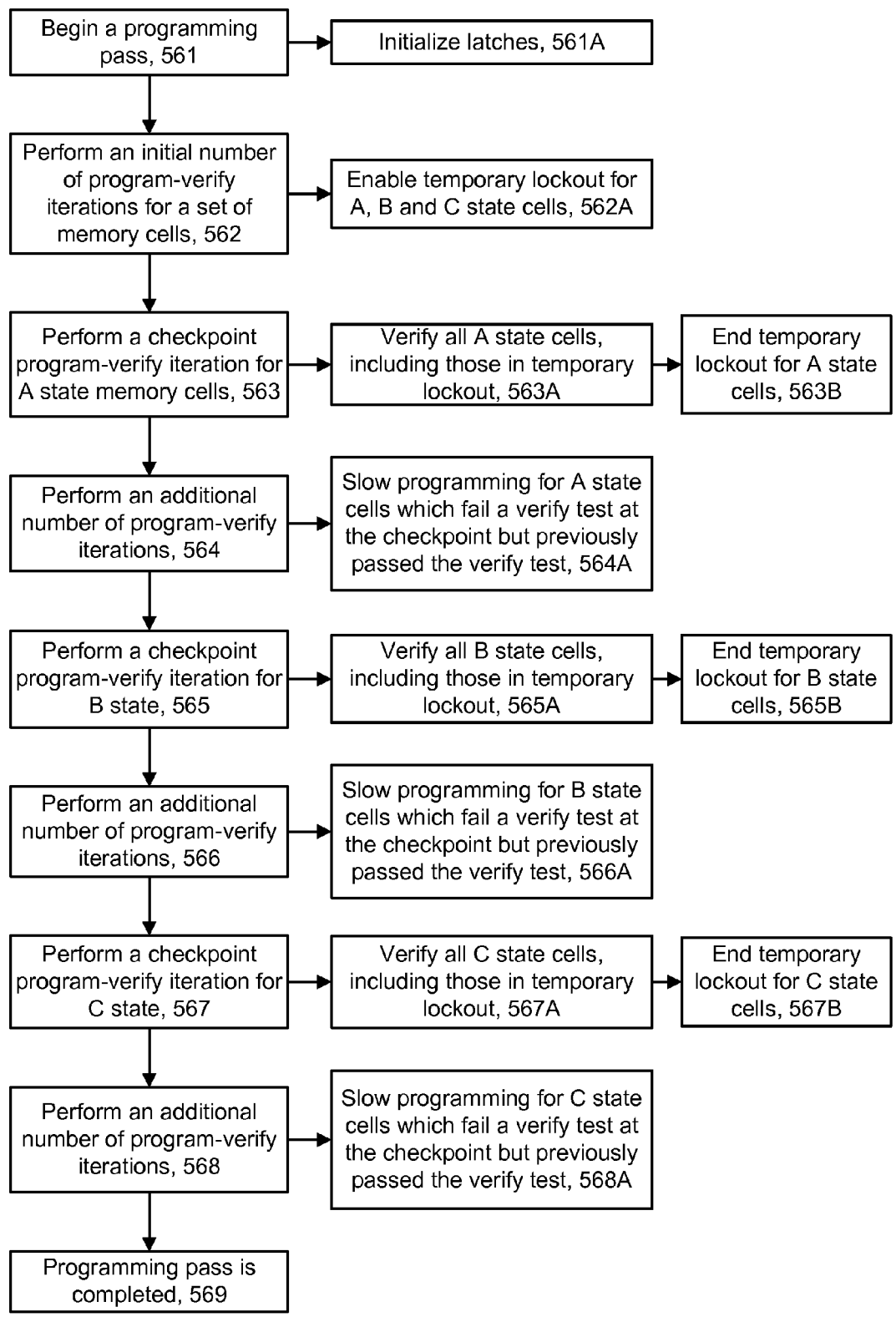
FIG. 5C depicts a specific implementation of a programming operation consistent with FIG. 5B.

FIG. 5C depicts a specific implementation of a programming operation consistent with FIG. 5A. In this approach, a programming pass is used to program memory cells to three target data states such as the A, B and C states in a four level memory device. An erased state is a fourth data state. Additionally, for each target data state, the programming pass has a special program-verify iteration referred to as a checkpoint program-verify iteration (or just a checkpoint) in which all of the memory cells are subject to a verify test. A goal of the checkpoint program-verify iteration is to identify memory cells that have previously passed the verify test but which no longer pass the same verify test due to detrapping. The programming which occurs after the checkpoint program-verify iteration provides a reprogramming or second programming of these detrapped memory cells. This pushes up the lower tail of the Vth distribution for the target data state. For the memory cells which have not previously reached the target data state, they continue to be programmed normally until they first pass the verify test.

The checkpoint program-verify iteration for a given target data state can be set at a point in the programming pass in which it is expected that a majority (e.g., 70-90%) of the memory cells of that target data state will have reached the verify level. This provides the opportunity to detect detrapping in a majority of the memory cells. Also, Vpgm will not have reached a relatively high level such that there is a risk of over programming during the reprogramming. Optionally, the checkpoint program-verify iteration could be performed after all or nearly all of the memory cells reach the verify level. One disadvantage is that the Vpgm will have reached a relatively high level such that there is a risk of over programming during the reprogramming. That is, the Vth of a memory cell could increase too much when the next programming voltage is applied.

A position of the checkpoint program-verify iteration for a given target data state in the programming pass can be predetermined. For instance, the checkpoint program-verify iteration for the A state can be the fifth program-verify iteration (or program loop) as in FIG. 11A. In another approach, a position of the checkpoint program-verify iteration in the programming pass can be adaptively determined based on a programming progress of the A state memory cells during an initial number of program-verify iterations. For example, a number of the A state memory cells which pass the verify test can be determined in each program-verify iteration until the number exceeds a threshold. At this point, the next program-verify iteration can be the checkpoint program-verify iteration. Or, the nth program-verify iteration after this point can be the checkpoint program-verify iteration, where n is a number of one or more. The checkpoint program-verify can be set for the other target data states similarly.

Reprogramming can be used for one or more of the target data states by provide a separate checkpoint program-verify iteration for each target data state. In some cases, one checkpoint program-verify iteration can be shared by memory cells having more than one target data state.

A programming pass begins at step 561. This step can involve initializing bit values in the latches at step 561A. For example, the bit combinations of FIGS. 10A, 10B, 10D and 10F can be provided for the E, A, B and C state memory cells, respectively. An initial number (one or more) of program-verify iterations is performed for the set of memory cells being programmed, e.g., the A, B and C state memory cells (step 562). For example, these can be PV1-PV4 in FIG. 11A. This step can involve enabling a temporary lockout mode for the A, B and C state memory cells (step 562A). In this mode, when a memory cell reaches a verify level (passes a verify test), the memory cell is temporarily locked out from further programming until the checkpoint program-verify iteration. A memory cell can be locked out from programming by raising a voltage of an associated bit line to a level which prevents programming while Vpgm is applied. The temporary lockout mode can be enabled by setting a verify bit in a set of latches of a memory cell, e.g., by setting VDL=1 as in FIGS. 10C, 10E and 10G.

Step 563 involves performing the checkpoint program-verify iteration for the A state memory cells. For example, this can be PV5 in FIG. 11A. This involves applying a programming voltage and then verifying all of the A state memory cells including those in the temporary lockout mode as well as those which are in the normal programming mode (step 563A). The temporary lockout mode is ended for the A state at step 563B and is no longer used in the programming pass. Thus, in the checkpoint program-verify iteration, the A state memory cells that pass the verify test are permanently locked out from programming in a remainder of the programming pass, and the A state memory cells that do not pass the verify test are subject to programming in a next program-verify iteration.

An additional number (one or more) of program-verify iterations is performed for the set of memory cells being programmed, e.g., the A, B and C state memory cells (step 564). For example, these can be PV6-PV8 in FIG. 11A. During the programming voltage of the program-verify iteration, the programming can be slowed for the A state cells which fail the verify test at the checkpoint but previously passed the same verify test (step 564A) (e.g., memory cell 1200 in FIG. 12), compared to the A state cells which fail the verify test at the checkpoint but did not previously pass the verify test (e.g., memory cell 1203 in FIG. 12). In this approach, some of the A state cells can be considered to be faster programming memory cells because they have already reached the verify level before the checkpoint, so that their programming speed after the checkpoint can be slowed relative to the programming speed of the slower A state cells. This slowing avoids a situation in which the Vth of a memory cell increased too much (e.g., is over-programmed) when the next programming voltage is applied. The second group of the A state cells can be subject to normal programming.

Another approach is to slow programming for both the first and second categories, e.g., by raising the bit line voltage for both the first and second categories and/or by reducing the Vpgm step size in the first program-verify iteration (e.g., see the step size dVpgm2 at PV6 in FIG. 11B) after the checkpoint program-verify iteration (e.g., PV5). This avoids the use of the latch VDL which tracks the temporary lock out mode.

The bit line voltage should not be increased too much because this reduces the window of the SGD transistor of a NAND string. If the allowed SGD bias window is too small, this can cause reliability problems or prevent cells from finishing programming.

In another approach, the slow programming mode can be ended after a specified number of program loops. For example, the slow programming mode can be ended for the A state at PV9 in FIG. 11B. All or nearly all of the A state memory cells will likely have completed programming at this point, such that the remaining A state memory cells are very slow programming and do not benefit from being slowed down further. In yet another approach, the bit line voltage can vary in the slow programming mode. For example, the bit line voltage can decrease with an increasing number of program loops. These approaches can be used for the other target data states as well.

In another approach, the slow programming mode can be a function of the target data state. For example, the bit line voltage can be higher for the C state memory cells than for the A or B state memory cells. A higher bit line voltage can help to slow down programming when Vpgm is relatively high, when the C state memory cells are still being programmed.

Step 565 involves performing the checkpoint program-verify iteration for the B state memory cells. For example, this can be PV9 in FIG. 11A. This involves applying a programming voltage and then verifying all of the B state memory cells including those in the temporary lockout mode as well as those which are in the normal programming mode (step 565A). The temporary lockout mode is ended for the B state at step 565B and is no longer used in the programming pass. Thus, in the checkpoint program-verify iteration, the B state memory cells that pass the verify test are permanently locked out from programming in a remainder of the programming pass, and the B state memory cells that do not pass the verify test are subject to programming in a next program-verify iteration.

An additional number (one or more) of program-verify iterations is performed for the set of memory cells being programmed, e.g., the A, B and C state memory cells (step 566). For example, these can be PV10-PV12 in FIG. 11A. During the programming voltage of the program-verify iteration, the programming can be slowed for the B state cells which fail the verify test at the checkpoint but previously passed the same verify test (step 566A) (e.g., memory cell 1204 in FIG. 12), compared to the B state cells which fail the verify test at the checkpoint but did not previously passed the verify test (e.g., memory cell 1207 in FIG. 12). In this approach, some of the B state cells can be considered to be faster programming memory cells because they have already reached the verify level before the checkpoint, so that their programming speed after the checkpoint should be slowed relative to the programming speed of the slower B state cells.

The second group of the C state cells can be subject to normal programming. Another approach is to slow programming for both the first and second categories, e.g., by raising the bit line voltage for both the first and second categories and/or by reducing the Vpgm step size in the first program-verify iteration (e.g., see the step size dVpgm3 at PV10 in FIG. 11B) after the checkpoint program-verify iteration (e.g., PV9).

Step 567 involves performing the checkpoint program-verify iteration for the C state memory cells. For example, this can be PV13 in FIG. 11A. This involves applying a programming voltage and then verifying all of the C state memory cells including those in the temporary lockout mode as well as those which are in the normal programming mode (step 567A). The temporary lockout mode is ended for the C state at step 567B and is no longer used in the programming pass. Thus, in the checkpoint program-verify iteration, the C state memory cells that pass the verify test are permanently locked out from programming in a remainder of the programming pass, and the C state memory cells that do not pass the verify test are subject to programming in a next program-verify iteration.

An additional number (one or more) of program-verify iterations is performed for the set of memory cells being programmed, e.g., the A, B and C state memory cells (step 568). For example, these can be PV15 and PV16 in FIG. 11A. During the programming voltage of the program-verify iteration, the programming can be slowed for the C state cells which fail the verify test at the checkpoint but previously passed the same verify test (step 568A) (e.g., memory cell 1208 in FIG. 12), compared to the C state cells which fail the verify test at the checkpoint but did not previously passed the verify test (e.g., memory cell 1211 in FIG. 12). In this approach, some of the C state cells can be considered to be faster programming memory cells because they have already reached the verify level before the checkpoint, so that their programming speed after the checkpoint should be slowed relative to the programming speed of the slower C state cells. The second group of the C state cells can be subject to normal programming. Another approach is to slow programming for both the first and second categories, e.g., by raising the bit line voltage for both the first and second categories and/or by reducing the Vpgm step size in the first program-verify iteration (e.g., see the step size dVpgm4 at PV14 in FIG. 11B) after the checkpoint program-verify iteration (e.g., PV13).

Using the slow programming mode for all of the C state cells could potentially increase the overall programming time since it can slow down the programming speed of the slowest C state memory cells. However, if the slow programming mode is used on some of C state memory cells but not on the second group of C state memory cells, overall programming time is not expected to increase. This is because some of C state memory cells are expected to be relatively fast programming and will complete reprogramming at about the same time as the second group of C state memory cells complete normal programming.

The programming pass is completed at step 569.

Note that the memory cells with the lower target data states will generally complete programming before the memory cells with the higher target data states. However, there will be some overlap such that some memory cells with different target data states complete programming in the same program-verify iteration. Thus, for a given target data state, some memory cells will complete programming at a lower program loop and other memory cells will complete programming at a higher program loop.

FIGS. 6A and 6B depict a one pass programming operation with four data states as an example of the programming pass of FIG. 5C. A single programming pass involves (only) one sequence of multiple program-verify operations which are performed starting from an initial Vpgm level and proceeding to a final Vpgm level until the threshold voltages of a set of selected memory cells reach one or more respective verify levels of respective target data states. All memory cells may initially be in an erased state at the beginning of a programming pass, such as in the Vth distributions of FIGS. 6A and 7A. Or, some of the memory cells may initially be in an erased state while other memory cells are in a higher state, such as the INT state in FIG. 7B. Thus, some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1C. For example, the LP bit can be stored in LDL and the UP bit can be stored in UDL.

A first Vth distribution 600 is provided for erased (Er) state memory cells. Three Vth distributions 602, 604 and 606 represent target data states A, B and C, respectively, which are reached by memory cells when their Vth exceeds the verify level VvA, VvB or VvC, respectively. In this case, each memory cell can store two bits of data in one of four possible Vth ranges, referred to as states Er (or E), A, B and C.

After a programming operation is completed, the data can be read from the memory cells using read reference voltages VrA, VrB and VrC which are between the Vth distributions. By testing whether the Vth of a given memory cell is above or below one or more of the read reference voltages, the system can determine the data state which is represented by a memory cell.

FIGS. 7A to 7C depict a two-pass programming operation with four data states as another example of the programming pass of FIG. 5C. The programming pass of FIG. 5C can be used on one or both of these programming passes. The final programming pass of a multi-pass programming operation is generally most important since this sets the final Vth distribution, so the reprogramming technique provided here should be used on at least the final programming pass.

Each programming pass can be used to program a page of data. Programming can be performed one logical page at a time, with the lower page followed by the upper page.

FIG. 7A depicts a Vth distribution of memory cells at a start of the programming operation. Initially, all memory cells are in the Er state, represented by the distribution 700 in FIG. 7A.

FIG. 7B depicts a Vth distribution of memory cells after programming of a lower page of data in a first programming pass. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify level Vv1. The data of these memory cells is represented by x0. Note that the interim distribution can be relatively wide since it is not a final distribution and does not represent a final data state.

FIG. 7C depicts a Vth distribution of memory cells after programming of an upper page of data in a second programming pass. If UP/LP=11, the associated memory cell in the distribution 700 remains in the distribution 700 and stores data bits 11. If UP/LP=01, the memory cells in the distribution 700 are programmed to the A state distribution 704 using VvA. If UP/LP=00, the memory cells in the distribution 702 are programmed to the B state distribution 706 using VvB. If UP/LP=10, the memory cells in the distribution 702 are programmed to the C state distribution 708 using VvC. Programming can be similarly extended to three or more bits per memory cell.

Figure 8:
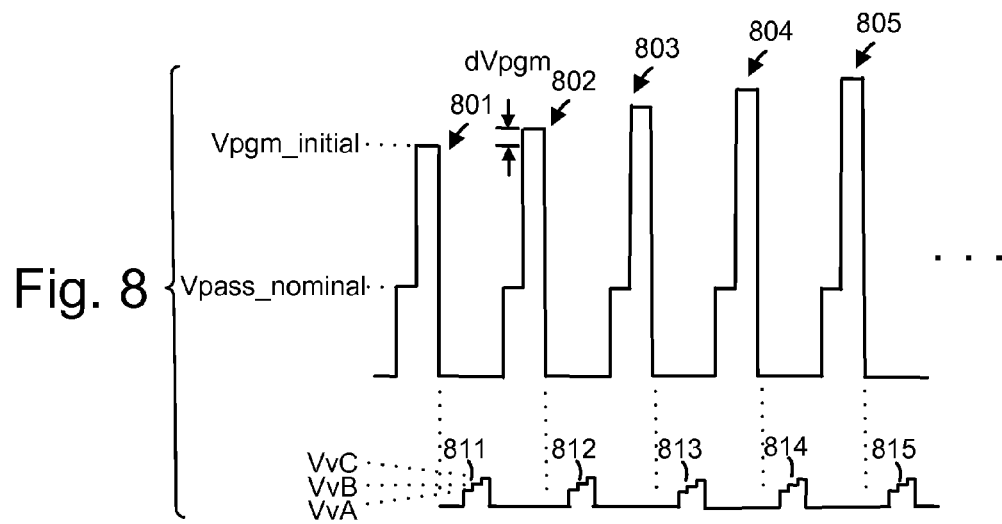
FIG. 8 depicts program and verify voltages in a programming pass, consistent with FIGS. 5B and 5C.

FIG. 8 depicts program and verify voltages in a programming pass, consistent with FIG. 5C. A programming pass may include a sequence of multiple program-verify iterations or program loops, where each program-verify iteration includes a program portion comprising a programming voltage and a following verify operation comprising one or more verify voltages. The programming voltage and verify voltages are applied to a selected word line.

In one approach, the programming voltages are stepped up in successive iterations by a step size, dVpgm. This is incremental step pulse programming. Moreover, each programming voltage may include a first portion which has a pass voltage (Vpass) level, e.g., 6-8 V, followed by a second, peak amplitude portion at a program level, e.g., 12-25 V. For example, this programming pass includes programming voltages 801-805 and associated sets of verify voltages 811-815, respectively. The initial programming voltage has a magnitude of Vpgm_initial. The verify voltages have a magnitude of VvA, VvB and VvC. In one approach, the verify voltages which are applied are based on the current program loop number so that verify voltages are provided for the A state initially in a programming pass, then for the A and B states at a middle part of the programming pass and then for the B and C states at a later part of the programming pass.

Figure 9:
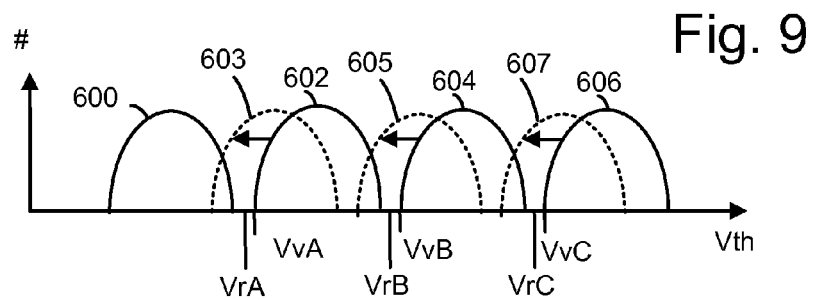
FIG. 9 depicts changes in a threshold voltage distribution due to de-trapping.

FIG. 9 depicts changes in a threshold voltage distribution due to de-trapping. As mentioned, detrapping results in a downshift in the Vth of a memory cell. The Vth distributions 600, 602, 604 and 606 of FIG. 6B are repeated. These Vth distributions represent a situation in which detrapping has not occurred or in which reprogramming has occurred to overcome the effects of detrapping. The Vth distributions 603, 605 and 607 represent a situation in which detrapping has occurred and has not been overcome by reprogramming. The Vth distribution for each target data state has shifted down by a significant amount.

FIG. 10A depicts a bit combination in a set of latches for a memory cell which is to remain in the erased state, or which is in a permanent lockout mode, consistent with the programming process of FIG. 5C. As mentioned, a set of latches such as depicted in FIG. 1C may be associated with each memory cell in a set of memory cells being programmed. In one approach, a latch LDL stores a bit of a lower page of data, a latch UDL stores a bit of an upper page of data and a latch VDL stores a verify bit. VDL=0 indicates the memory cell has not been temporarily locked out, e.g., the memory cell has not passed the verify test before the checkpoint program-verify iteration. This memory cell is programmed normally and not reprogrammed. VDL=1 indicates the memory cell has been temporarily locked out, e.g., the memory cell has passed the verify test before the checkpoint program-verify iteration. This memory cell may be reprogrammed if it fails the verify test at the checkpoint.

The value of VDL can thus be used before the checkpoint to determine whether a memory cell should be in the temporary lockout mode. After the checkpoint, the temporary lockout mode is no longer enabled, and the value of VDL can be used to determine whether a memory cell is being reprogrammed and therefore should be subject to slow programming. For example, an elevated bit line voltage is used when VDL=1 and a non-elevated bit line voltage (e.g., Vb1=0 V) is used when VDL=0. The value of VDL is thus used differently before and after the checkpoint in a programming pass.

VDL is at least one bit which indicates whether a memory cell passed a verify test during an initial number of program-verify iterations, where the at least one bit is used to set a voltage of an associated bit line during one or more program-verify iterations of the additional number of program-verify iterations. The bit combinations depicted are examples.

In this figure, LDL/UDL/VDL=11x, where x denotes 0 or 1, for a memory cell which is to remain in the E state, or for an A, B or C state memory cell which is in a permanent lockout mode for a remainder of a programming pass.

FIG. 10B depicts an initial bit combination in a set of latches for a memory cell which is to be programmed to the A state, consistent with step 561A of FIG. 5C. LDL/UDL=01 indicates the A state is the target data state and VDL=0 indicates the memory cell has not yet passed the A state verify test before the checkpoint.

FIG. 10C depicts a bit combination in a set of latches for a memory cell which is to be programmed to the A state, after passing a verify test before the A state checkpoint of step 563 of FIG. 5C. LDL/UDL=01 indicates the A state is the target data state and VDL=1 indicates the memory cell has passed the A state verify test before the checkpoint. VDL remains at 1 for a remainder of the programming pass, in one approach.

FIG. 10D depicts an initial bit combination in a set of latches for a memory cell which is to be programmed to the B state, consistent with step 561A of FIG. 5C. LDL/UDL=00 indicates the B state is the target data state and VDL=0 indicates the memory cell has not yet passed the B state verify test before the checkpoint.

FIG. 10E depicts a bit combination in a set of latches for a memory cell which is to be programmed to the B state, after passing a verify test before the B state checkpoint of step 565 of FIG. 5C. LDL/UDL=00 indicates the B state is the target data state and VDL=1 indicates the memory cell has passed the B state verify test before the checkpoint.

FIG. 10F depicts an initial bit combination in a set of latches for a memory cell which is to be programmed to the C state, consistent with step 561A of FIG. 5C. LDL/UDL=10 indicates the C state is the target data state and VDL=0 indicates the memory cell has not yet passed the C state verify test before the checkpoint.

FIG. 10G depicts a bit combination in a set of latches for a memory cell which is to be programmed to the C state, after passing a verify test before the C state checkpoint of step 567 of FIG. 5C. LDL/UDL=10 indicates the C state is the target data state and VDL=1 indicates the memory cell has passed the C state verify test before the checkpoint.

Figure 11A:
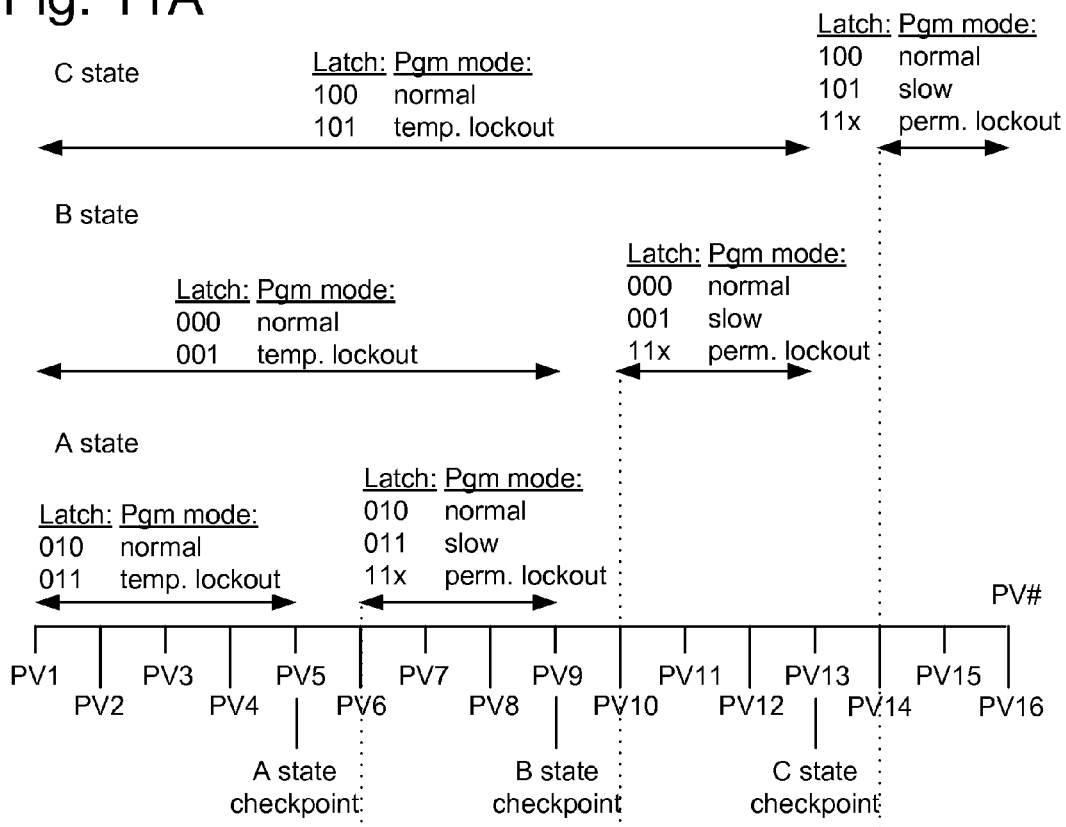
FIG. 11A depicts latch values for memory cells as a function of a program-verify iteration number in a programming pass.

FIG. 11A depicts latch values for memory cells as a function of a program-verify iteration number in a programming pass. The horizontal axis depicts a program-verify (PV) iteration number or program loop in a program pass, ranging from a first program-verify iteration PV1 to a last program-verify iteration PV16. For each target data state, latch values are provided in the order of: LDL/UDL/VDL and a corresponding programming mode is indicated. The latch values indicated are at the start of the PV iteration.

From PV1-PV5, the A state memory cells have a latch value of 010 which indicates the memory cell is subject to normal programming, or a latch value of 011 which indicates the memory cell is subject to temporary lockout. The latch values can be accessed at the start of each program-verify iteration to determine the mode of the memory cell for the program-verify iteration. During the programming voltage of the program-verify iteration, the latch values indicate a bit line voltage which should be applied to the memory cell via an associated bit line. During the verify portion of the program-verify iteration voltage, the latch values indicate whether a sensing result should be obtained for the memory cell and, if a sensing result should be obtained, the target data state of the sensing result. During the checkpoint program-verify iteration for the A state, all of the A state memory cells are subject to the A state verify test.

From PV6-PV9, the A state memory cells have a latch value of 010 which indicates the memory cell is subject to normal programming, a latch value of 011 which indicates the memory cell is subject to slow programming, or a latch value of 11x which indicates the memory cell is subject to permanent lockout.

From PV1-PV9, the B state memory cells have a latch value of 000 which indicates the memory cell is subject to normal programming, or a latch value of 001 which indicates the memory cell is subject to temporary lockout.

From PV10-PV13, the B state memory cells have a latch value of 000 which indicates the memory cell is subject to normal programming, a latch value of 001 which indicates the memory cell is subject to slow programming, or a latch value of 11x which indicates the memory cell is subject to permanent lockout.

From PV1-PV13, the C state memory cells have a latch value of 100 which indicates the memory cell is subject to normal programming, or a latch value of 101 which indicates the memory cell is subject to temporary lockout.

From PV14-PV16, the C state memory cells have a latch value of 100 which indicates the memory cell is subject to normal programming, a latch value of 101 which indicates the memory cell is subject to slow programming, or a latch value of 11x which indicates the memory cell is subject to permanent lockout.

As mentioned, one option is to use the slow programming mode after the checkpoint for all memory cells of a target data state.

In this example, the A, B and C state memory cells complete programming in PV9, PV13 and PV16, respectively.

Figure 11B:
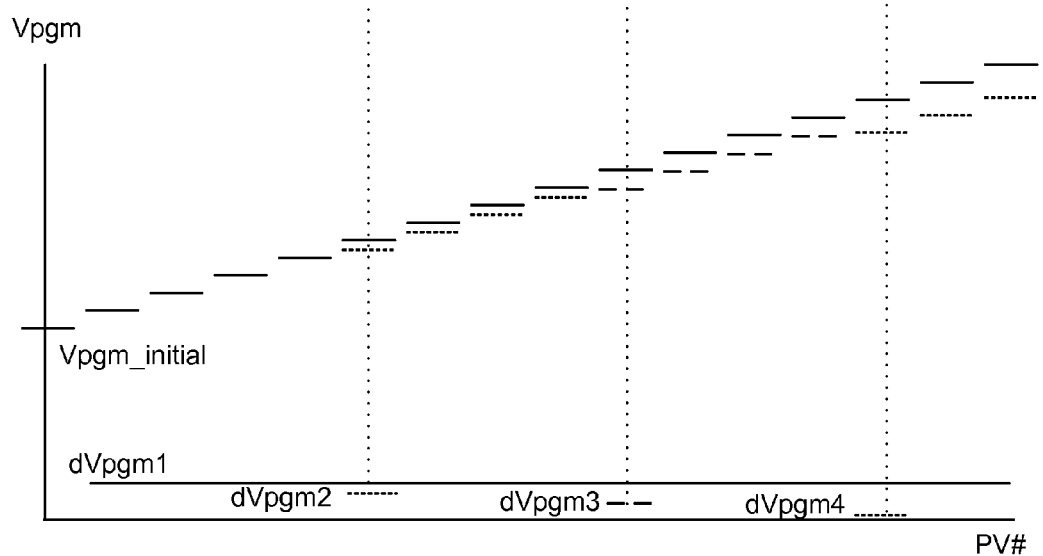
FIG. 11B depicts a programming voltage Vpgm and a step size as a function of a program-verify iteration number in a programming pass.

FIG. 11B depicts a programming voltage Vpgm and a step size as a function of a program-verify iteration number in a programming pass. The horizontal axis depicts a program-verify (PV) iteration number or program loop and is time-aligned with the horizontal axis of FIG. 11A. The vertical axis depicts a step-wise increasing value of Vpgm and values of the step size, dVpgm. Vpgm_initial, consistent with FIG. 8, is the initial value of Vpgm in PV1. In one option, a fixed step size of dVpgm1 is used through the programming pass. In another approach, the step size in the first program-verify iteration after a checkpoint is reduced relative to dVpgm1. For example, dVpgm1 is used for PV2-PV5, PV7-PV9, PV11-PV13, PV15 and PV16, dVpgm2<dVpgm1 is used for PV6, dVpgm3<dVpgm1 is used for PV10 and dVpgm4<dVpgm1 is used for PV14.

Further, the step size in the first program-verify iteration after a checkpoint can be a function of the target data state of the checkpoint. The step size may be relatively lower when the target data state has a higher verify level since Vpgm will have reached a relatively higher level and a relatively lower step size may be appropriate to slow programming. In this case, dVpgm4<dVpgm3<dVpgm2<dVpgm1. Further the step sizes dVpgm4, dVpgm3 and dVpgm2 can be positive or negative.

Figure 12:
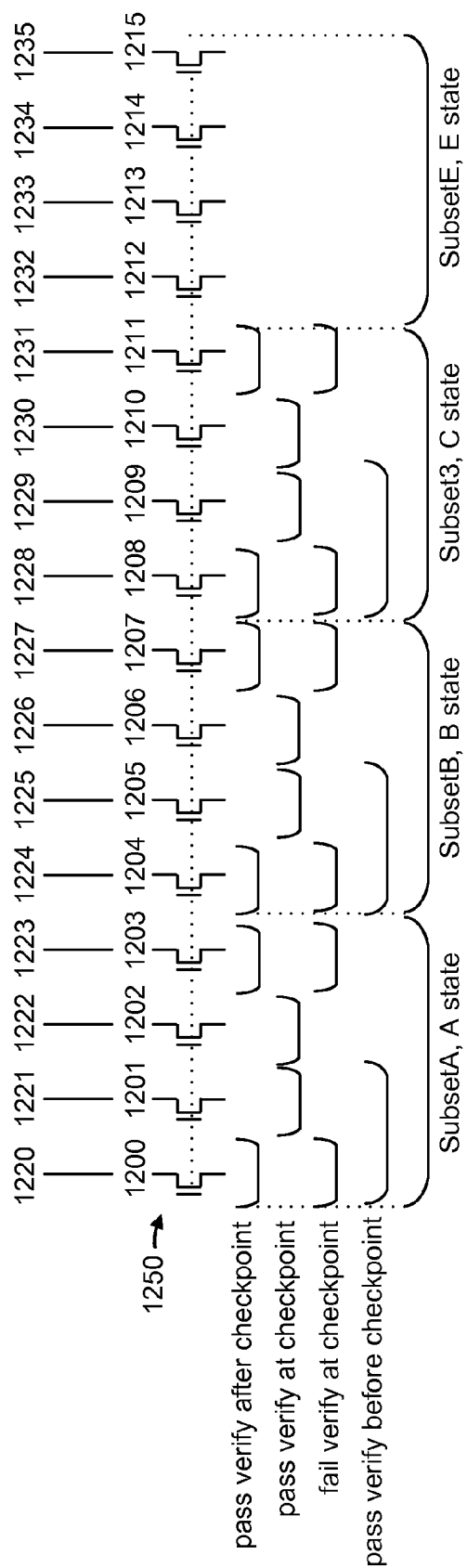
FIG. 12 depicts an example set of memory cells.

FIG. 12 depicts an example set 1250 of memory cells, including memory cells 1200-1215 and associated bit lines 1220-1235. In a simplified example, subsetA includes memory cells with the A state as the target data state, subsetB includes memory cells with the B state as the target data state, subsetC includes memory cells with the C state as the target data state, and subsetE includes memory cells in the E state. In subsetA, memory cell 1200 passes the verify test before the checkpoint and after the checkpoint, memory cell 1201 passes the verify test before the checkpoint and at the checkpoint, memory cell 1202 passes the verify test only at the checkpoint, and memory cell 1203 passes the verify test only after the checkpoint. In this case, memory cell 1200 is reprogrammed.

SubsetA, subsetB and subsetC are first, second and third subsets, respectively. Memory cells 1200 and 1201 are a first group of memory cells among the first subset of memory cells which pass a first verify test (A state verify test) during the initial number of program-verify iterations. Memory cells 1202 and 1203 are a second group of memory cells among the first subset of memory cells which do not pass the first verify test during the initial number of program-verify iterations. In the first group, memory cell 1200 fails the first verify test during the checkpoint program-verify iteration and memory cell 1201 passes the first verify test during the checkpoint program-verify iteration. In the second group, memory cell 1202 passes the verify test in the checkpoint program-verify iteration and memory cell 1203 passes the verify test after the checkpoint program-verify iteration.

In subsetB, memory cells 1204-1207 are similar to memory cells 1200-1203, respectively, relative to the verify test of the B state. In subsetC, memory cells 1208-1211 are similar to memory cells 1200-1203, respectively, relative to the verify test of the C state.

Accordingly, it can be seen that, in one embodiment, a method for programming in a memory device (100) comprises: performing an initial number of program-verify iterations (PV1-PV4; PV1-PV8; PV1-PV12) of a programming pass for a set of memory cells (Set3), the set of memory cells is connected to a common word line (WLL0-WLL23, 524) and comprises a first subset (SubsetA) of memory cells having a first target data state (A state), each program-verify iteration of the initial number of program-verify iterations comprises a program portion in which a programming voltage (801-805) is applied to the word line and a verify portion (811-815) in which a first verify test is performed; after the initial number of program-verify iterations, performing a checkpoint program-verify iteration (PV5, PV9, PV13) of the programming pass, the checkpoint program-verify iteration comprises a program portion in which the programming voltage is applied to the word line and a verify portion in which the first verify test is performed for each memory cell in the first subset of memory cells; and after the checkpoint program-verify iteration, performing an additional number of program-verify iterations (PV6-PV16; PV10-PV16; PV14-PV16) of the programming pass. The performing the additional number of program-verify iterations comprises continuing programming, until the first verify test is passed, of memory cells (1200) among the first subset of memory cells which passed the first verify test during the initial number of program-verify iterations but did not pass the first verify test during the checkpoint program-verify iteration and memory cells (1203) among the first subset of memory cells which did not pass the first verify test during the initial number of program-verify iterations and during the checkpoint program-verify iteration.

In another embodiment, a memory device comprises: a set of memory cells (SubsetA) connected to a word line in a memory structure, the set of memory cells comprising a first subset (1200-1203) of memory cells having a first target data state; and a control circuit (110, 112, 114, 116, 122, 128, 132, 192, MC0, SB0). The control circuit: performs an initial number of program-verify iterations of a programming pass for the set of memory cells each program-verify iteration of the initial number of program-verify iterations comprises a program portion in which a programming voltage is applied to the word line and a verify portion in which a first verify test is performed; after the initial number of program-verify iterations, performs a checkpoint program-verify iteration of the programming pass, the checkpoint program-verify iteration comprises a program portion in which the programming voltage is applied to the word line and a verify portion in which the first verify test is performed for each memory cell in the first subset of memory cells; and after the checkpoint program-verify iteration, performs an additional number of program-verify iterations of the programming pass, the performing the additional number of program-verify iterations comprises continuing programming, until the first verify test is passed, of memory cells among the first subset of memory cells which passed the first verify test during the initial number of program-verify iterations but did not pass the first verify test during the checkpoint program-verify iteration and memory cells among the first subset of memory cells which did not pass the first verify test during the initial number of program-verify iterations and during the checkpoint program-verify iteration.

In another embodiment, a method for programming in a memory device, comprises: performing an initial number of program-verify iterations of a programming pass for a set of memory cells, the set of memory cells is connected to a common word line and comprises a first subset of memory cells having a first target data state, each program-verify iteration of the initial number of program-verify iterations comprises a program portion in which a programming voltage is applied to the word line and a verify portion in which a first verify test is performed; identifying a first group of memory cells among the first subset of memory cells which pass the first verify test during the initial number of program-verify iterations; identifying a second group of memory cells among the first subset of memory cells which do not pass the first verify test during the initial number of program-verify iterations; after the initial number of program-verify iterations, performing a checkpoint program-verify iteration of the programming pass, the checkpoint program-verify iteration comprises a program portion in which the programming voltage is applied to the word line and a verify portion in which the first verify test is performed for each memory cell in the first and second groups of memory cells; identifying and providing a permanent lockout mode for memory cells in the first and second group of memory cells which pass the first verify test during the checkpoint program-verify iteration; identifying and providing a slow programming mode for memory cells in the first group of memory cells which fail the first verify test during the checkpoint program-verify iteration; and identifying and providing a normal programming mode memory cells in the second group of memory cells which fail the first verify test during the checkpoint program-verify iteration.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a memory device, comprising:
performing an initial number of program-verify iterations of a programming pass for a set of memory cells, the set of memory cells is connected to a word line and comprises a first subset of memory cells having a first target data state, each program-verify iteration of the initial number of program-verify iterations comprises a program portion in which a programming voltage is applied to the word line and a verify portion in which a first verify test is performed;
after the initial number of program-verify iterations, performing a checkpoint program-verify iteration of the programming pass, the checkpoint program-verify iteration comprises a program portion in which the programming voltage is applied to the word line and a verify portion in which the first verify test is performed for each memory cell in the first subset of memory cells; and
after the checkpoint program-verify iteration, performing an additional number of program-verify iterations of the programming pass, the performing the additional number of program-verify iterations comprises continuing programming, until the first verify test is passed, of memory cells among the first subset of memory cells which passed the first verify test during the initial number of program-verify iterations but did not pass the first verify test during the checkpoint program-verify iteration and memory cells among the first subset of memory cells which did not pass the first verify test during the initial number of program-verify iterations and during the checkpoint program-verify iteration, wherein:
for each of the memory cells among the first subset of memory cells which passed the first verify test during the initial number of program-verify iterations but did not pass the first verify test during the checkpoint program-verify iteration and each of the memory cells which did not pass the first verify test during the initial number of program-verify iterations and during the checkpoint program-verify iteration, a set of latches comprises bits which identify the first target data state and at least one bit which indicates whether the memory cell passed the first verify test during the initial number of program-verify iterations, and the at least one bit is used to set a voltage of an associated bit line during one or more program-verify iterations of the additional number of program-verify iterations.

2. The method of claim 1, wherein:
a first set of bit lines is associated with the memory cells which passed the first verify test during the initial number of program-verify iterations but did not pass the first verify test during the checkpoint program-verify iteration;
a second set of bit lines is associated with the memory cells which did not pass the first verify test during the initial number of program-verify iterations and during the checkpoint program-verify iteration; and
a voltage of the first set of bit lines is higher than a voltage of the second set of bit lines during one or more program-verify iterations of the additional number of program-verify iterations.

3. The method of claim 1, wherein:
bit lines are associated with the memory cells which passed the first verify test during the initial number of program-verify iterations but did not pass the first verify test during the checkpoint program-verify; and
a voltage of the bit lines is higher during the additional number of program-verify iterations than during the initial number of program-verify iterations.

4. The method of claim 3, wherein:
the programming voltage increases in a fixed step during each program-verify iteration of the initial number of program-verify iterations, the checkpoint program-verify iteration and the additional number of program-verify iterations.

5. The method of claim 4, wherein:
the set of memory cells comprises a second subset of memory cells;
the programming voltage is applied to the set of memory cells in each program-verify iteration of the initial number of program-verify iterations, the checkpoint program-verify iteration and the additional number of program-verify iterations; and
the programming voltage is used to program the second subset of memory cells toward a second target data state, higher than the first target data state, during the initial number of program-verify iterations, the checkpoint program-verify iteration and the additional number of program-verify iterations.

6. The method of claim 1, wherein:
the programming voltage increases in a first step during each program-verify iteration of the initial number of program-verify iterations and in the checkpoint program-verify iteration, and increases in a second step, smaller than the first step, in a first program-verify iteration of the additional number of program-verify iterations.

7. The method of claim 6, wherein:
the second step is a function of the first target data state.

8. The method of claim 1, wherein:
a position of the checkpoint program-verify iteration in the programming pass is predetermined.

9. The method of claim 1, wherein:
a position of the checkpoint program-verify iteration in the programming pass is adaptively determined based on a programming progress of the first subset of memory cells during the initial number of program-verify iterations.

10. The method of claim 1, wherein:
the set of memory cells comprise charge-trapping memory cells.

11. The method of claim 10, wherein:
the set of memory cells is in a three-dimensional stacked memory structure comprising alternating conductive layers and dielectric layers; and
the set of memory cells is connected to one of the conductive layers.

12. The method of claim 1, wherein:
the set of memory cells is arranged in a three-dimensional structure.

13. A memory device, comprising:
a set of memory cells connected to a word line in a memory structure, the set of memory cells comprising a first subset of memory cells having a first target data state;
a set of latches; and
a control circuit, the control circuit is configured to:
perform an initial number of program-verify iterations of a programming pass for the set of memory cells, each program-verify iteration of the initial number of program-verify iterations comprises a program portion in which a programming voltage is applied to the word line and a verify portion in which a first verify test is performed;

after the initial number of program-verify iterations, perform a checkpoint program-verify iteration of the programming pass, the checkpoint program-verify iteration comprises a program portion in which the programming voltage is applied to the word line and a verify portion in which the first verify test is performed for each memory cell in the first subset of memory cells; and after the checkpoint program-verify iteration, perform an additional number of program-verify iterations of the programming pass, the performing the additional number of program-verify iterations comprises continuing programming, until the first verify test is passed, of memory cells among the first subset of memory cells which passed the first verify test during the initial number of program-verify iterations but did not pass the first verify test during the checkpoint program-verify iteration and memory cells among the first subset of memory cells which did not pass the first verify test during the initial number of program-verify iterations and during the checkpoint program-verify iteration, wherein:

for each of the memory cells among the first subset of memory cells which passed the first verify test during the initial number of program-verify iterations but did not pass the first verify test during the checkpoint program-verify iteration and each of the memory cells which did not pass the first verify test during the initial number of program-verify iterations and during the checkpoint program-verify iteration, the set of latches comprises bits which identify the first target data state and at least one bit which indicates whether the memory cell passed the first verify test during the initial number of program-verify iterations; and the control circuit is configured to use the at least one bit to set a voltage of an associated bit line during one or more program-verify iterations of the additional number of program-verify iterations.

14. The memory device of claim 13, wherein:
a first set of bit lines is associated with the memory cells which passed the first verify test during the initial number of program-verify iterations but did not pass the first verify test during the checkpoint program-verify iteration;
a second set of bit lines is associated with the memory cells which did not pass the first verify test during the initial number of program-verify iterations and during the checkpoint program-verify iteration; and
a voltage of the first set of bit lines is higher than a voltage of the second set of bit lines during one or more program-verify iterations of the additional number of program-verify iterations.

15. The memory device of claim 13, wherein:
bit lines are associated with the memory cells which passed the first verify test during the initial number of program-verify iterations but did not pass the first verify test during the checkpoint program-verify; and
voltages of the bit lines are higher during the additional number of program-verify iterations than during the initial number of program-verify iterations.

16. The memory device of claim 13, wherein:
the set of memory cells comprise charge-trapping memory cells.

17. The memory device of claim 13, wherein:
the set of memory cells is arranged in a three-dimensional structure.

18. A method for programming in a memory device, comprising:
performing an initial number of program-verify iterations of a programming pass for a set of memory cells, the set of memory cells is connected to a word line and comprises a first subset of memory cells having a first target data state, each program-verify iteration of the initial number of program-verify iterations comprises a program portion in which a programming voltage is applied to the word line and a verify portion in which a first verify test is performed;

identifying a first group of memory cells among the first subset of memory cells which pass the first verify test during the initial number of program-verify iterations;

identifying a second group of memory cells among the first subset of memory cells which do not pass the first verify test during the initial number of program-verify iterations;

after the initial number of program-verify iterations, performing a checkpoint program-verify iteration of the programming pass, the checkpoint program-verify iteration comprises a program portion in which the programming voltage is applied to the word line and a verify portion in which the first verify test is performed for each memory cell in the first and second groups of memory cells;

identifying and providing a permanent lockout mode for memory cells in the first and second group of memory cells which pass the first verify test during the checkpoint program-verify iteration;

identifying and providing a slow programming mode for memory cells in the first group of memory cells which fail the first verify test during the checkpoint program-verify iteration; and identifying and providing a normal programming mode for memory cells in the second group of memory cells which fail the first verify test during the checkpoint program-verify iteration, wherein:

for each of the memory cells among the first subset of memory cells which passed the first verify test during the initial number of program-verify iterations but did not pass the first verify test during the checkpoint program-verify iteration and each of the memory cells which did not pass the first verify test during the initial number of program-verify iterations and during the checkpoint program-verify iteration, a set of latches comprises bits which identify the first target data state and at least one bit which indicates whether the memory cell passed the first verify test during the initial number of program-verify iterations, and the at least one bit is used to set a voltage of an associated bit line during one or more program-verify iterations of an additional number of program-verify iterations.

19. The method of claim 18, wherein:
the slow programming mode is provided by using an elevated bit line voltage; and
the normal programming mode is provided by using a non-elevated bit line voltage.

* * * * *